(12) United States Patent
Ikada et al.

(10) Patent No.: US 7,785,490 B2
(45) Date of Patent: Aug. 31, 2010

(54) PR-DOPED INORGANIC COMPOUND, LUMINESCENT COMPOSITION AND LUMINESCENT BODY CONTAINING THE SAME, AND LIGHT EMITTING DEVICE

(75) Inventors: Tomotake Ikada, Ashigarakami-gun (JP); Masayuki Suzuki, Ashigarakami-gun (JP); Masahiro Takata, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 845 days.

(21) Appl. No.: 11/639,256

(22) Filed: Dec. 15, 2006

(65) Prior Publication Data

US 2007/0138942 A1 Jun. 21, 2007

(30) Foreign Application Priority Data

Dec. 15, 2005 (JP) .............................. 2005-361337
Feb. 6, 2006 (JP) .............................. 2006-028033

(51) Int. Cl.
C09K 11/02 (2006.01)
C09K 11/77 (2006.01)
H01J 17/00 (2006.01)
H01J 19/00 (2006.01)
F21V 7/04 (2006.01)
G01S 1/00 (2006.01)
G09B 9/00 (2006.01)
H01S 3/00 (2006.01)
H01S 3/30 (2006.01)

(52) U.S. Cl. .............................. 252/301.4 R; 313/503; 362/553

(58) Field of Classification Search .......... 252/301.4 R; 313/503; 362/553
See application file for complete search history.

(56) References Cited

U.S. PATENT DOCUMENTS 6,246,744 B1 6/2001 Duclos et al.
6,793,848 B2 * 9/2004 Vartuli et al. ......... 252/301.4 R

FOREIGN PATENT DOCUMENTS

JP 2001-72968 A 3/2001
WO WO 2005/083422 A2 9/2005
WO WO 2006/129228 A2 12/2006

OTHER PUBLICATIONS

Wisniewska, M. Luminescence and scintillation properties of YAG:Pr. Nuclear Sciece, IEEE Transactions on, Jun. 2002, vol. 49, Issue 3, pp. 926-930.*
V. Nekvasil. Crystal field in praseodymium gallium garnet. Journal of Alloys and Compounds. vols. 275-277, Jul. 24, 1998, pp. 288-290.*
Allik, H. Preparation, structure, and spectroscopic properties of $Nd^{3+}:\{La1-xLux\}3[Lu1-yGay]2Ga3O12$ crystals. Phys. Rev. B 37, 9129-9139.*
Antic-Fidancev., E., et al, "Crystal fields in $Pr^{3+}$ doped rare earth gallium garnets, $RE_3Ga_5O_{12}:Pr^{3+}$," *J. Phys.: Conden. Matter*, 4 (1992) 8321-8330. In English.
M. Malinowski, et al. "Visible Laser Emission of $Pr^{3+}$ in Various Hosts", Journal de Physique IV, pp. C4-541-C4-544, 1994.
A. Ikesue, et al. "Development and Prospect of Ceramic Laser Elements", Laser Review, vol. 27, No. 9, pp. 593-598, 1999.
A. Ikesue, et al. "Synthesis of Pr Heavily-Doped, Transparent YAG Ceramics", Journal of the Ceramic Society of Japan, vol. 109, No. 7, pp. 640-642, 2001.
M. Nikl, et al., "Photo- and Radioluminescence of Pr-Doped $Lu_3Al_5O_{12}$ Single Crystal" Phys. Stat. Sol. (a), vol. 202, No. 1, pp. R4-R6, 2005.
T.H. Allik, et al. "Preparation, Structure, and Spectroscopic Properties of $Nd^{3+}:(La_{1-x}Lu_x)_3[Lu_{1-y}Ga_y]_2Ga_3O_{12}$ Crystals", Physical Review B, vol. 37.
J.B. Gruber, et al. "Comparative Analysis of $Nd^{3+}$ ($4f^3$) Energy Levels in Four Garnet Hosts", Physical Review B. vol. 41, No. 12, pp. 7999-8012, 1990.
F. Hanson, et al. "Laser Diode Side Pumping of Neodymium Laser Rods", Applied Optics, vol. 27, No. 1, pp. 80-83, 1988.
New Version Laser Handbook (published by Asakura Shoten), pp. 183-197, 1989.

* cited by examiner

*Primary Examiner*—C. Melissa Koslow
*Assistant Examiner*—Matthew E Hoban
(74) *Attorney, Agent, or Firm*—Sughrue Mion, PLLC

(57) ABSTRACT

A Pr-doped inorganic compound contains a solid solution having been formed by substitution of at least a part of at least one kind of substitutable ions, which are contained at a substitutable ion site in a matrix oxide, by Pr. The Pr-doped inorganic compound satisfies the condition represented by the formula:

$$0.91r2 \leq r1 \leq 1.05r2$$

wherein r1 represents the mean ionic radius of ionic radiuses of all of elements, including Pr, which elements constitute the substitutable ion site having been doped with Pr, and r2 represents the ionic radius of Pr.

11 Claims, 16 Drawing Sheets

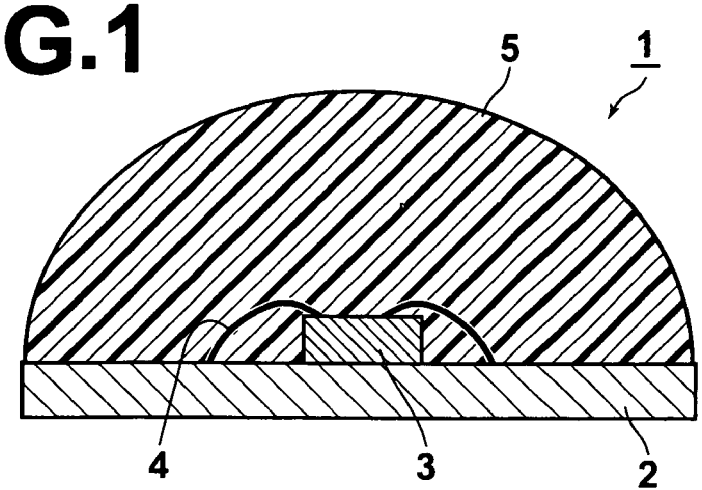
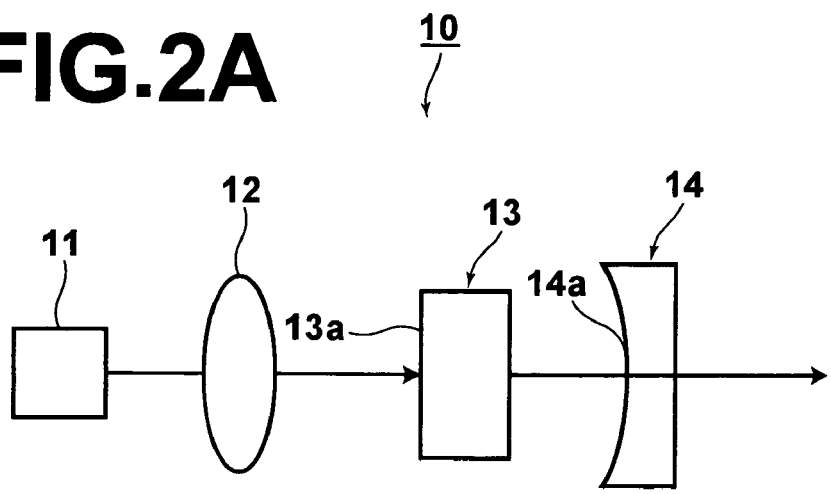
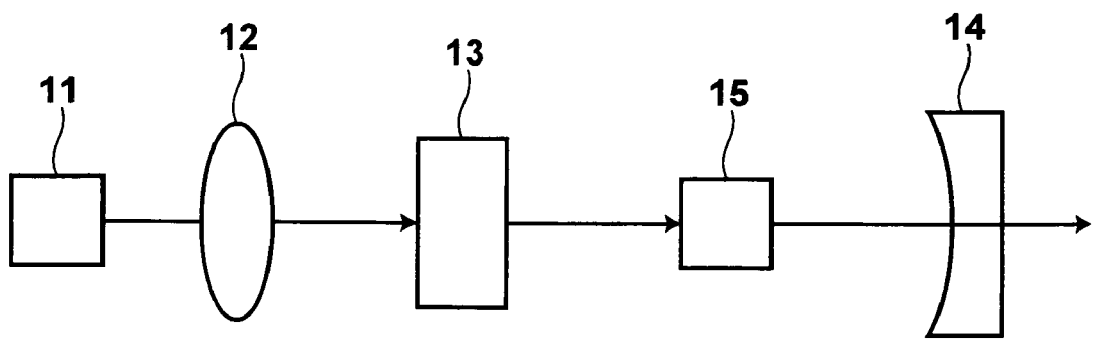

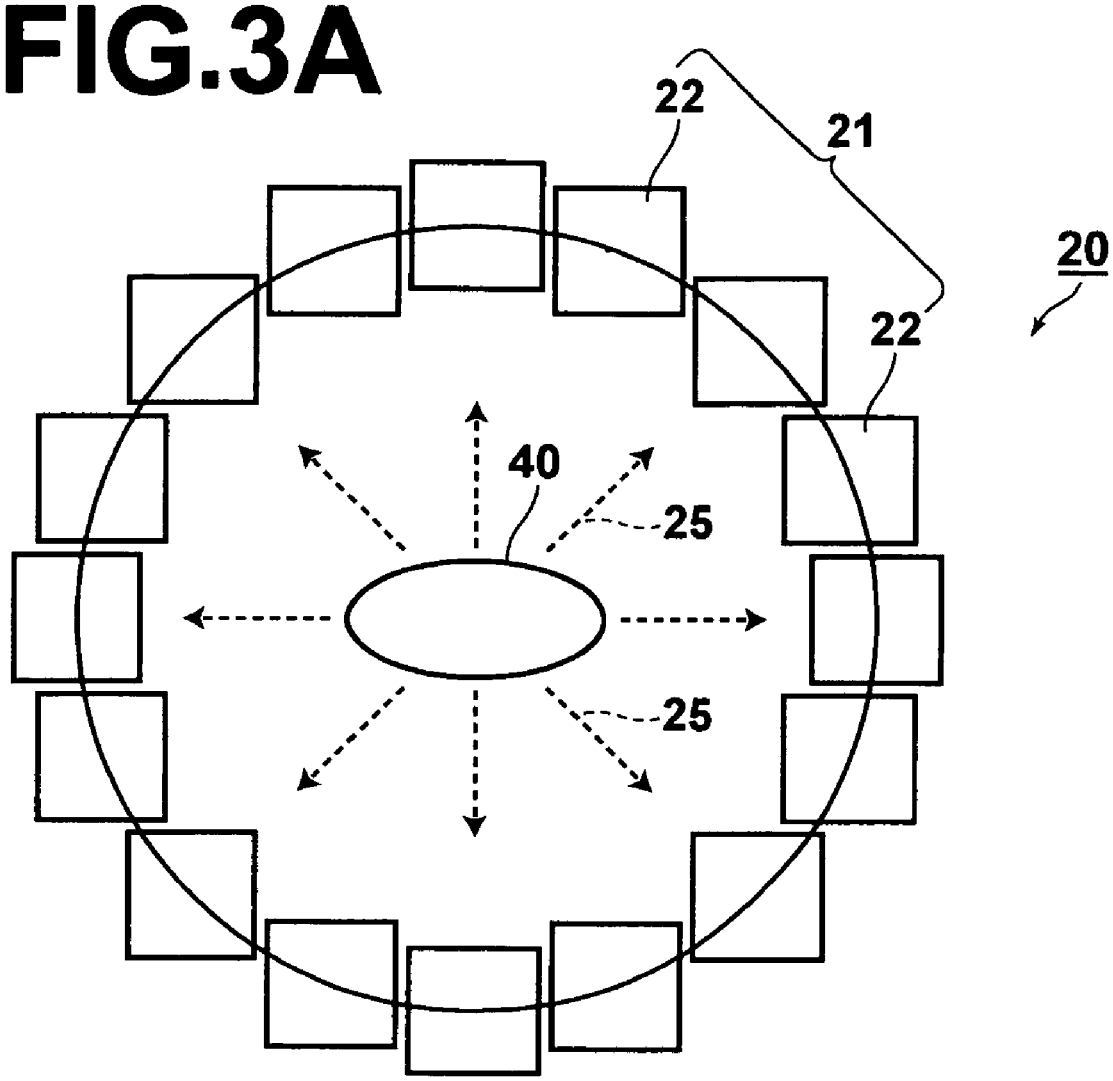

BODY AXIS DIRECTION

EXCITATION: 449nm, FLUORESCENCE: 484nm

"z" IN $(La_{2.67}Lu_{0.3}Pr_{0.03})(Lu_{2-z}Ga_z)Ga_3O_{12}$

Pr:LSGG
$[(La_{2.77}Sc_{0.2}Pr_{0.03})Sc_2Ga_3O_{12}]$ $2\theta$/deg

PR-DOPED INORGANIC COMPOUND, LUMINESCENT COMPOSITION AND LUMINESCENT BODY CONTAINING THE SAME, AND LIGHT EMITTING DEVICE

This is a non-provisional application which claims priority from Korean patent application 2005-361337 filed Dec. 15, 2005, and from Korean patent application 2006-028033 filed on Feb. 6, 2006, all of which are incorporated herein by reference.

BACKGROUND OF THE INVENTION

1. Field of the Invention

This invention relates to a Pr-doped inorganic compound, such as a Pr-doped garnet type compound. This invention also relates to a luminescent composition and a luminescent body, each of which contains the Pr-doped inorganic compound. This invention further relates to a light emitting device, a solid laser device, and an ionizing radiation detecting device, each of which utilizes the luminescent body.

2. Description of the Related Art

As inorganic compounds, which are capable of being exited by irradiation of exciting light and are thereby capable of producing luminescence, there have heretofore been known the inorganic compounds containing rare earth element ions as luminescence center ions. As for Pr, which is one of the rare earth elements, it has been known that Pr exhibits a plurality of luminescence (fluorescence) peaks in a wide wavelength range of an ultraviolet region to an infrared region, and it has therefore been thought that Pr is useful as a luminescent material.

Examples of matrix compounds to be doped with Pr include halides, such as fluorides, oxyhalides, chalcogenides, and oxychalcogenides. The compounds enumerated above are chemically unstable and have the problems with regard to the production cost in that, for example, large-scale production equipment is required. Therefore, the compounds enumerated above are not appropriate for the matrix compounds to be doped with Pr.

As the matrix compounds to be doped with Pr, oxides, such as garnet type compounds, which are chemically stable and are capable of being produced at a low cost, are preferable. In, for example, "Visible Laser Emission of $Pr^{3+}$ in Various Hosts", M. Malinowski et al., Journal de Physique IV, pp. C4-541-C4-544, 1994, an inorganic compound (Pr:YAG), in which $Y_3Al_5O_{12}$ (YAG) that is one of the garnet type compound is utilized as the matrix compound, and in which Pr has been doped into the matrix compound YAG, is described. In the aforesaid literature, it is reported that Pr:YAG produces a blue laser beam (487.9 nm, at most 32K) and an orange laser beam (616 nm, at most 140K) when being excited (in this case, pumped) by a dye laser beam having a wavelength of 480 nm at low temperatures.

However, it has heretofore been stated that it is not always possible to form a solid solution of Pr in YAG. Specifically, in cases where Pr is to be doped in YAG, a part of $y^{3+}$ ions at an A site are substituted by $Pr^{3+}$ ions through the formation of the solid solution. However, an ionic radius (=0.1126 nm) of the $Pr^{3+}$ ions (at the A site) is larger than the ionic radius (=0.1019 nm) of the $Y^{3+}$ ions (at the A site). Therefore, a coefficient of segregation at the time of the doping of Pr in YAG is approximately equal to zero (as described in, for example, "Development and Prospect of Ceramic Laser Elements", A. Ikesue et al., Laser Review, Vol. 27, No. 9, pp. 593-598, 1999.) The foregoing indicates that it is not always possible to form the solid solution of Pr in YAG. FIG. 20 is a graph showing relationships between ionic radiuses of rare earth element ions, which are to be doped in YAG, and segregation coefficients of the rare earth element ions.

In, for example, "Synthesis of Pr Heavily-Doped, Transparent YAG Ceramics", A. Ikesue and Y. Sato, Journal of the Ceramic Society of Japan, Vol. 109, No. 7, pp. 640-642, 2001, there is described that, in the cases of a single crystal, it is not always possible to produce Pr:YAG, in which a Pr doping concentration is higher than 1 mol %.

As for a poly crystal sintered body, in, for example, the aforesaid "Synthesis of Pr Heavily-Doped, Transparent YAG Ceramics", A. Ikesue and Y. Sato, Journal of Ceramic Society of Japan, Vol. 109, No. 7, pp. 640-642, 2001, a report is made on a compound (4.3% Pr-YAG), in which Pr is doped at a concentration of 4.3 mol % in YAG. However, as described above, the difference in ionic radius between the $Y^{3+}$ ions, which act as the substitutable ions, and the $Pr^{3+}$ ions, which act as the substituent ions, is large. Therefore, there is the possibility that a lattice strain will occur at positions in the vicinity of the $Pr^{3+}$ ions, and that oxygen defects will occur. Since a lattice strain and lattice defects will cause deactivation of excited photons to occur, there is the risk that the lattice strain and the lattice defects will adversely affect the luminescence characteristics, such as a fluorescence intensity.

As a Pr-doped inorganic compound, in which an oxide other than the garnet type compounds is utilized as the matrix compound, a compound, in which $YAlO_3$ is utilized as the matrix compound, and in which Pr is doped in $YAlO_3$, is described in, for example, "CW-Lasing of Pr:$YAlO_3$ at Room Temperature", A. Bleckmann et al., OSA Proceedings on Advanced Solid-State Lasers, Vol. 15, pp. 199-201, 1993. In the literature described above, it is reported that the compound, in which Pr is doped in $YAlO_3$, produces laser beams having wavelengths ranging from a red region to a near infrared region when being excited by an Ar laser beam having a wavelength of 476.5 nm. However, the compound described in the aforesaid literature is of the system of substitutable ions $Y^{3+}$/substituent ions $Pr^{3+}$ and is in the same circumstances as those described above with respect to Pr:YAG.

As a Pr-doped inorganic compound, in which the substitutable ions are other than the $y^{3+}$ ions, a compound (Pr:$Lu_3Al_5O_{12}$), in which Pr is doped in $Lu_3Al_5O_{12}$, is reported as a scintillator material in, for example, "Photo- and Radioluminescence of Pr-Doped $Lu_3Al_5O_{12}$ Single Crystal", M. Nikl et al., Phys. Stat. Sol. (a), Vol. 202, No. 1, pp. R4-R6, 2005. The ionic radius of the $Lu^{3+}$ ions (at the A site) is equal to 0.977 nm. Since the ionic radius of the $Lu^{3+}$ ions is smaller than the ionic radius of the $Y^{3+}$ ions, the difference in ionic radius between the substitutable ions and the substituent ions is larger than the difference in ionic radius in the cases of Pr:YAG, and therefore it is thought that the Pr doping in $Lu_3Al_5O_{12}$ will be more difficult than in the cases of Pr:YAG.

SUMMARY OF THE INVENTION

The primary object of the present invention is to provide a novel idea of material designing for facilitating Pr doping in a matrix oxide.

Another object of the present invention is to provide a Pr-doped inorganic compound having a novel composition having been designed in accordance with the novel idea of material designing.

A further object of the present invention is to provide a Pr-doped inorganic compound, which enables Pr doping at a high concentration to be achieved through facilitating of the Pr doping.

The specific object of the present invention is to provide a Pr-doped inorganic compound, which exhibits good luminescence characteristics, such as a fluorescence intensity, through facilitating of the Pr doping.

The present invention provides a Pr-doped inorganic compound, containing a solid solution having been formed by substitution of at least a part of at least one kind of substitutable ions, which are contained at a substitutable ion site in a matrix oxide, by Pr, the Pr-doped inorganic compound satisfying the condition represented by the formula:

$$0.91r2 \leq r1 \leq 1.05r2$$

wherein r1 represents the mean ionic radius of ionic radiuses of all of elements, including Pr, which elements constitute the substitutable ion site having been doped with Pr, and r2 represents the ionic radius of Pr.

The Pr-doped inorganic compound in accordance with the present invention embraces both the Pr-doped inorganic compound, in which a part of the substitutable ion site in the matrix oxide has been substituted by Pr, and the Pr-doped inorganic compound, in which the entire substitutable ion site in the matrix oxide has been substituted by Pr.

The Pr-doped inorganic compound in accordance with the present invention has been obtained from the material designing conducted with attention being paid to the mean ionic radius r1 of the ionic radiuses of all of the elements, including Pr, which elements constitute the substitutable ion site having been doped with Pr, and the ionic radius r2 of Pr acting as the substituent ions, such that the difference between the mean ionic radius r1 and the ionic radius r2 of Pr may be small, and such that the condition represented by the formula shown above may be satisfied.

The Pr-doped inorganic compound in accordance with the present invention should preferably be modified such that the substitutable ions contain La and/or Gd.

The term "ionic radius" as used herein means the so-called "Shannon's ionic radius." (As for the Shannon's ionic radius, reference may be made to, for example, "Revised Effective Ionic Radii and Systematic Studies of Interatomic Distances in Halides and Chalcogenides", R. D. Shannon, Acta Cryst., Vol. A32, PP. 751-767, 1976.) The term "mean ionic radius" as used herein means the quantity represented by the formula $\Sigma C_i R_i$, wherein C represents the molar fraction of the ions of each element located at the lattice site, and R represents the ionic radius of the ions of each element.

The molar fraction C of the ions of each element located at the lattice site is capable of being calculated with the processing, in which the crystal structure is identified with powder X-ray diffraction (XRD) measurement or single crystal X-ray diffraction measurement, and in which an ICP luminescence analysis is then performed. In cases where raw material particles are mixed and sintered to yield a singe phase sintered body, the molar fraction C of the ions of each element located at the lattice site is capable of being calculated with the processing, in which the crystal structure is identified, and in which the molar fraction C is calculated in accordance with the mixing ratio of the raw material particles.

The Pr-doped inorganic compound in accordance with the present invention may have a single crystalline structure or a polycrystalline structure and may contain inevitable impurities. Also, the Pr-doped inorganic compound in accordance with the present invention should preferably be of a single phase as a whole. However, the Pr-doped inorganic compound in accordance with the present invention may contain a heterogeneous phase within a range such that the characteristics of the Pr-doped inorganic compound may not be affected adversely.

As the garnet type matrix compounds, in which La is contained at the substitutable ion site, there have heretofore been reported $(La_{3-x}Lu_x)(Lu_{2-y}Ga_y)Ga_3O_{12}$ [LLGG] and $(La_{3-x}Sc_x)(Sc_{2-y}Ga_y)Ga_3O_{12}$ [LSGG]. After examples of syntheses of the garnet type matrix compounds described above were reported in, for example, a literature of Journal of Solid State Chemistry, 8, 357 (1973), research has been conducted on luminescent compounds, in which Nd or Cr is doped in LLGG or LSGG, particularly LLGG, and examples of production of laser beams with the luminescent compounds have been reported. (Reference may be made to, for example, "Preparation, Structure, and Spectroscopic Properties of $Nd^{3+}$: $(La_{1-x}Lu_x)_3[Lu_{1-y}Ga_y]_2Ga_3O_{12}$ Crystals", T. H. Allik et al., Physical Review B, Vol. 37, No. 16, pp. 9129-9139, 1988; "Comparative Analysis of $Nd^{3+}$ ($4f^3$) Energy Levels in Four Garnet Hosts", J. B. Gruber et al., Physical Review B, Vol. 41, No. 12, pp. 7999-8012, 1990; "Laser Diode Side Pumping of Neodymium Laser Rods", F. Hanson and D. Haddock, Applied Optics, Vol. 27, No. 1, pp. 80-83, 1988; and New Version Laser Handbook (published by Asakura Shoten), pp. 183-197, 1989.) However, nothing has been reported with respect to research on doping of other kinds of rare earth element ions, such as Pr, in the garnet type matrix compounds, in which La is contained at the substitutable ion site.

As the garnet type matrix compounds, in which Gd is contained at the substitutable ion site, there have heretofore been reported $Gd_3Ga_5O_{12}$, $Gd_3Sc_2Ga_3O_{12}$, and $Gd_3Sc_2Al_3O_{12}$. Research has been conducted on luminescent compounds, in which Nd, Cr, Ho, or Er is doped in the garnet type matrix compounds described above, and examples of production of laser beams with the luminescent compounds have been reported. (Reference may be made to, for example, New Version Laser Handbook (published by Asakura Shoten), p. 183, (1989).) However, as in the cases of LLGG or LSGG, nothing has been reported with respect to positive research on doping of other kinds of rare earth element ions, such as Pr, in the garnet type matrix compounds, in which Gd is contained as the substitutable ions.

Further, there has heretofore been no precedent for the material designing with respect to the Pr doping into the garnet type matrix compound, in which La or Gd is contained at the substitutable ion site, the material designing being conducted with attention being paid to the mean ionic radius r1 of the ionic radiuses of all of the elements, including Pr, which elements constitute the substitutable ion site having been substituted by Pr through the formation of the solid solution, and the ionic radius r2 of Pr acting as the substituent ions. The circumstances are the same as those described above also for the matrix oxides other than the garnet type matrix compound, in which La or Gd is contained at the substitutable ion site. Specifically, the idea itself of the material designing in accordance with the present invention, wherein the Pr-doped inorganic compound is designed with attention being paid to the mean ionic radius r1 of the ionic radiuses of all of the elements, including Pr, which elements constitute the substitutable ion site having been doped with Pr, and the ionic radius r2 of Pr acting as the substituent ions, is a novel designing idea.

The Pr-doped inorganic compound in accordance with the present invention should preferably be modified such that the Pr-doped inorganic compound is a garnet type compound (1), which may be represented by General Formula (1) shown below, or a garnet type compound, which may be represented by General Formula (2) shown below.

(1) A garnet type compound (1), which may be represented by General Formula (1):

$$(Al_{3-x-y}A2_xPr_y)B_2C_3O_{12} \qquad (1)$$

wherein each of A1, A2, and Pr represents the element at the A site,

B represents the element at the B site,
C represents the element at the C site,
A1 represents La, or A1 represents La and Gd,
A2 represents at least one kind of element selected from the group consisting of Y, Lu, and Sc,
B represents at least one kind of element selected from the group consisting of Lu, Sc, Ga, and Al,
C represents at least one kind of element selected from the group consisting of Ga and Al,
x represents a number satisfying the condition $0 \leq x < 3$,
y represents a number satisfying the condition $0 < y \leq 3$,
provided that $0 < x+y \leq 3$, and
O represents the oxygen atom.

(2) A garnet type compound (2), which may be represented by General Formula (2):

$$(Al_{3-x-y}A2_xPr_y)B_2C_3O_{12} \qquad (2)$$

wherein each of A1, A2, and Pr represents the element at the A site,

B represents the element at the B site,
C represents the element at the C site,
A1 represents La, or A1 represents La and Gd,
A2 represents at least one kind of element selected from the group consisting of Y, Lu, and Sc,
B represents at least two kinds of elements selected from the group consisting of Lu, Sc, Ga, and Al,
C represents at least one kind of element selected from the group consisting of Ga and Al,
x represents a number satisfying the condition $0 \leq x < 3$,
y represents a number satisfying the condition $0 < y \leq 3$,
provided that $0 < x+y \leq 3$, and
O represents the oxygen atom.

Besides the garnet type compounds, the Pr-doped inorganic compound in accordance with the present invention is also applicable to C-rare earth type compounds, perovskite type compounds, and the like.

The present invention also provides a luminescent composition, containing the Pr-doped inorganic compound in accordance with the present invention.

The present invention further provides a luminescent body, containing the Pr-doped inorganic compound in accordance with the present invention, the luminescent body having been formed into a predetermined shape.

The luminescent body in accordance with the present invention should preferably be modified such that the luminescent body takes on the form selected from the group consisting of a single crystal body of the Pr-doped inorganic compound in accordance with the present invention, a polycrystal sintered body of the Pr-doped inorganic compound in accordance with the present invention, and a molded body, which contains a solid medium and particles of the Pr-doped inorganic compound in accordance with the present invention having been dispersed in the solid medium.

The present invention still further provides a light emitting device, comprising:

i) the luminescent body in accordance with the present invention, and ii) an exciting light source for producing exciting light to be irradiated to the luminescent body.

The present invention also provides a solid laser device, comprising:

i) a solid laser medium constituted of the luminescent body in accordance with the present invention, and ii) an exciting light source for producing exciting light to be irradiated to the solid laser medium.

The present invention further provides an ionizing radiation detecting device, comprising:

i) a scintillator constituted of the luminescent body in accordance with the present invention, and ii) a scintillation photodetector for detecting light, which has been radiated out from the scintillator.

The Pr-doped inorganic compound in accordance with the present invention contains the solid solution having been formed by the substitution of at least a part of at least one kind of the substitutable ions, which are contained at the substitutable ion site in the matrix oxide, by Pr. The Pr-doped inorganic compound in accordance with the present invention satisfies the condition represented by the formula:

$$0.91 r2 \leq r1 \leq 1.05 r2$$

wherein r1 represents the mean ionic radius of the ionic radiuses of all of the elements, including Pr, which elements constitute the substitutable ion site having been doped with Pr, and r2 represents the ionic radius of Pr.

The Pr-doped inorganic compound in accordance with the present invention should preferably be modified such that the substitutable ions contain La and/or Gd.

The Pr-doped inorganic compound in accordance with the present invention has been obtained from the material designing conducted such that the mean ionic radius r1 of the ionic radiuses of all of the elements, including Pr, which elements constitute the substitutable ion site having been doped with Pr, may be close to the ionic radius r2 of Pr acting as the substituent ions. With the aforesaid constitution of the Pr-doped inorganic compound in accordance with the present invention, the substitutable ions are capable of being easily substituted by Pr through the formation of the solid solution. Therefore, the Pr doping into the matrix oxide is capable of being facilitated.

With the Pr-doped inorganic compound in accordance with the present invention, the Pr doping at a high concentration is capable of being achieved through the facilitating of the Pr doping. Also, with the Pr-doped inorganic compound in accordance with the present invention, the Pr-doped inorganic compound, which exhibits good luminescence characteristics, such as the fluorescence intensity, is capable of being furnished through the facilitating of the Pr doping.

The present invention will hereinbelow be described in further detail with reference to the accompanying drawings.

BRIEF DESCRIPTION OF THE DRAWINGS

FIG. 1 is a sectional view showing an embodiment of the light emitting device in accordance with the present invention, the view being taken in a thickness direction of a circuit base plate, FIG. 2A is an explanatory view showing an embodiment of the solid laser device in accordance with the present invention, FIG. 2B is an explanatory view showing an example of design modification of the solid laser device in accordance with the present invention, FIG. 3A is an explanatory view showing an example of a positron emission tomographic apparatus provided with an embodiment of the ionizing radiation detecting device in accordance with the present invention, the view being taken from the side of a head of an object.

DETAILED DESCRIPTION OF THE INVENTION

Figure 3B:
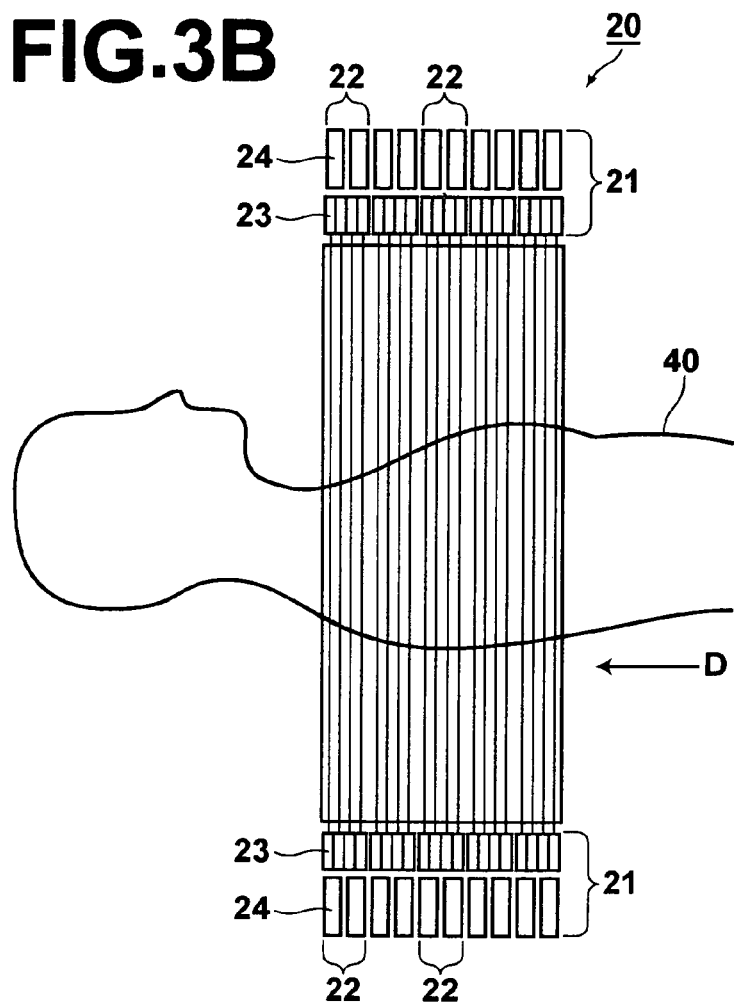
FIG. 3B is an explanatory view showing the positron emission tomographic apparatus of FIG. 3A, the view being taken from a lateral side of the object.

[Pr-doped Inorganic Compound in Accordance with the Present Invention]

The Pr-doped inorganic compound in accordance with the present invention contains the solid solution having been formed by the substitution of at least a part of the at least one kind of the substitutable ions, which are contained at the substitutable ion site in the matrix oxide, by Pr, the Pr-doped inorganic compound satisfying the condition represented by the formula:

$$0.91 r2 \leq r1 \leq 1.05 r2$$

wherein r1 represents the mean ionic radius of the ionic radiuses of all of the elements, including Pr, which elements constitute the substitutable ion site having been doped with Pr, and r2 represents the ionic radius of Pr.

Table 1A shows the ionic radius r of each of principal trivalent rare earth element ions and the ionic radius ratio (=r/r2) of the ionic radius r of each of the principal trivalent rare earth element ions to the ionic radius r2 of Pr in cases where the coordination number is eight. Table 1B shows the ionic radius r of each of the principal trivalent rare earth element ions and the ionic radius ratio (=r/r2) of the ionic radius r of each of the principal trivalent rare earth element ions to the ionic radius r2 of Pr in cases where the coordination number is six. (In table 1A and Table 1B, the ionic radius r is represented in units of Å.)

As shown in Table 1A and Table 1B, the difference in ionic radius between each of Lu and Y, which are the substitutable ions in the matrix oxides of the conventionally proposed Pr-doped inorganic compounds, and Pr is large, and the ionic radius ratio r/r2 is smaller than 0.91. In the cases of the substitutable ions associated with the ionic radius ratio r/r2 smaller than 0.91, the mean ionic radius r1 of the ionic radiuses of all of the elements, including Pr, which elements constitute the substitutable ion site having been doped with Pr, is not always capable of satisfying the condition represented by the formula shown above.

The Pr-doped inorganic compound in accordance with the present invention has been designed such that the matrix oxide may have the composition containing element ions, which have an ionic radius closer to the ionic radius r2 of Pr than the ionic radius of Lu or Y is, as the substitutable ions, and such that the condition represented by the formula shown above may be satisfied. Specifically, the Pr-doped inorganic compound in accordance with the present invention may contain, as the substitutable ions, La and/or Gd having the ionic radius r satisfying the condition represented by the formula $0.91 r2 \leq r \leq 1.05 r2$.

TABLE 1A

| | Coordination number: eight | |
|---|---|---|
| Ions | Ionic radius r | Ionic radius ratio to Pr = r/r2 |
| Lu | 0.977 | 0.0867673 |
| Y | 1.019 | 0.904973 |
| Gd | 1.053 | 0.935169 |
| Pr | 1.126 | 1 |
| La | 1.16 | 1.030195 |

TABLE 1B

| | Coordination number: six | |
|---|---|---|
| Ions | Ionic radius r | Ionic radius ratio to Pr = r/r2 |
| Lu | 0.861 | 0.869697 |
| Y | 0.9 | 0.909091 |
| Gd | 0.938 | 0.947475 |
| Pr | 0.99 | 1 |
| La | 1.032 | 1.042424 |

The Pr-doped inorganic compound in accordance with the present invention has been obtained from the material designing conducted such that the mean ionic radius r1 of the ionic radiuses of all of the elements, including Pr, which elements constitute the substitutable ion site having been doped with Pr, may be close to the ionic radius r2 of Pr acting as the substituent ions. With the aforesaid constitution of the Pr-doped inorganic compound in accordance with the present invention, the substitutable ions are capable of being easily substituted by Pr through the formation of the solid solution. Therefore, the Pr doping into the matrix oxide is capable of being facilitated. It is also possible for the entire substitutable ion site to be substituted by Pr.

With the Pr-doped inorganic compound in accordance with the present invention, the Pr doping at a high concentration is capable of being achieved through the facilitating of the Pr doping. Also, with the Pr-doped inorganic compound in accordance with the present invention, the Pr-doped inorganic compound, which exhibits good luminescence characteristics, such as the fluorescence intensity, is capable of being furnished through the facilitating of the Pr doping.

Of La and Gd described above, at least La should particularly preferably be contained as the substitutable ions in the matrix oxide. As shown in Table 1A and Table 1B, the difference in ionic radius between La and Pr is smaller than the difference in ionic radius between Gd and Pr. Also, La has the ionic radius larger than the ionic radius of Pr. Therefore, La is capable of being substituted by Pr through the formation of the solid solution than Gd is.

With evaluation made on Example 1 and Example 5, which will be described later, the inventors have confirmed that, in the cases of the system, in which the La site having the large ionic radius is substituted by Pr having the small ionic radius through the formation of the solid solution, the Vegard's law, which represents that the lattice constant alters approximately linearly with respect to an increase in Pr doping concentration, obtains over a wide range of Pr doping concentration, and the Pr doping at a high concentration is capable of being achieved easily. (Reference may be made to FIG. 6A and FIG. 14.)

By way of example, the Pr-doped inorganic compound in accordance with the present invention is applicable to garnet type compounds. Examples of the Pr-doped garnet type compounds in accordance with the present invention include the garnet type compound (1) and the garnet type compound (2) described below.

(1) A garnet type compound (1), which may be represented by General Formula (1):

$(Al_{3-x-y}A2_xPr_y)B_2C_3O_{12}$ (1)

wherein each of A1, A2, and Pr represents the element at the A site,

B represents the element at the B site,
C represents the element at the C site,
A1 represents La, or A1 represents La and Gd,
A2 represents at least one kind of element selected from the group consisting of Y, Lu, and Sc,
B represents at least one kind of element selected from the group consisting of Lu, Sc, Ga, and Al,
C represents at least one kind of element selected from the group consisting of Ga and Al,
x represents a number satisfying the condition $0 \leq x < 3$,
y represents a number satisfying the condition $0 < y \leq 3$,
provided that $0 < x+y \leq 3$, and
O represents the oxygen atom.

The garnet type compound (1) in accordance with the present invention should preferably be Pr:LLGG represented by General Formula (1), wherein A1 represents La, A2 represents Lu, B represents at least one kind of element selected from the group consisting of Lu and Ga, and C represents Ga.

The inventors have found that, with Pr:LLGG having the composition described above, a good single phase structure is capable of being obtained reliably in cases where $0 < x < 0.7$, preferably $0.2 \leq x \leq 0.6$. (Reference may be made to FIG. 11A.)

Also, the inventors have found that, with Pr:LLGG having the composition described above, a fluorescence intensity of a level at least equivalent to the level of the fluorescence intensity exhibited by Pr:YAG is capable of being obtained over a range of x as wide as $0 < x \leq 0.8$. (Reference may be made to FIG. 11B.)

Further, the inventors have found that, with Pr:LLGG having the composition described above, the luminescent characteristics are exhibited in cases where $0 < y < 1.35$, and a high fluorescence intensity is capable of being obtained in cases where $0 < y \leq 0.3$, preferably $0 < y \leq 0.21$. (Reference may be made to FIG. 9.)

Also, the garnet type compound (1) in accordance with the present invention should preferably be Pr: LSGG represented by General Formula (1), wherein A1 represents La, A2 represents Sc, B represents at least one kind of element selected from the group consisting of Sc and Ga, and C represents Ga.

The inventors have found that, with Pr:LSGG represented by General Formula (1), wherein A1 represents La, A2 represents Sc, B represents Sc, and C represents Ga, a good single phase structure is capable of being obtained reliably in cases where $0<x<0.25$, preferably $0.05 \leq x \leq 0.2$. (Reference may be made to FIG. 17.)

Also, the inventors have found that, with Pr:LSGG having the composition described above, the luminescent characteristics are exhibited in cases where $0<y<0.9$, preferably $0<y \leq 0.6$. (Reference may be made to FIG. 16.) Further, the inventors have found that, with Pr:LSGG, a fluorescence intensity higher than the fluorescence intensity exhibited by Pr:LLGG is capable of being obtained. (Reference may be made to FIG. 11B and FIG. 18.)

(2) A garnet type compound (2), which may be represented by General Formula (2):

$$(Al_{3-x-y}A2_xPr_y)B_2C_3O_{12} \quad (2)$$

wherein each of A1, A2, and Pr represents the element at the A site,
B represents the element at the B site,
C represents the element at the C site,
A1 represents La, or A1 represents La and Gd,
A2 represents at least one kind of element selected from the group consisting of Y, Lu, and Sc,
B represents at least two kinds of elements selected from the group consisting of Lu, Sc, Ga, and Al,
C represents at least one kind of element selected from the group consisting of Ga and Al,
x represents a number satisfying the condition $0 \leq x<3$,
y represents a number satisfying the condition $0<y \leq 3$,
provided that $0<x+y \leq 3$, and
O represents the oxygen atom.

By way of example, the garnet type compound (2) may be Pr:LLGG, which may be represented by General Formula (2a):

$$(Al_{3-x-y}A2_xPr_y)(B1_{2-z}B2_z)C_3O_{12} \quad (2a)$$

wherein each of A1, A2, and Pr represents the element at the A site,
each of B1 and B2 represents the element at the B site,
C represents the element at the C site,
A1 represents La,
A2 represents Lu,
B1 represents Lu,
B2 represents Ga,
C represents Ga,
x represents a number satisfying the condition $0 \leq x<3$,
y represents a number satisfying the condition $0<y \leq 3$,
provided that $0<x+y \leq 3$,
z represents a number satisfying the condition $0<z<2$, and
O represents the oxygen atom.

The inventors have found that, with Pr:LLGG having the aforesaid composition represented by General Formula (2a), wherein a small amount of Ga is contained at the B site, it is possible to obtain the fluorescence intensity higher than the fluorescence intensity exhibited by the composition containing no Ga at the B site. Specifically, the inventors have found that, with Pr:LLGG having the aforesaid composition represented by General Formula (2a), in cases where z takes a value falling within the range of $0<z \leq 0.4$, a fluorescence intensity of a level at least equivalent to the level of the fluorescence intensity exhibited by Pr:YAG is capable of being obtained. Particularly, the inventors have found that, with Pr:LLGG having the aforesaid composition represented by General Formula (2a), in cases where z takes a value falling within the range of $0.1 \leq z \leq 0.3$, a fluorescence intensity higher than the fluorescence intensity exhibited by Pr:YAG is capable of being obtained. (Reference may be made to FIG. 12.)

Also, the inventors have found that each of the garnet type compound (1) and the garnet type compound (2) in accordance with the present invention is capable of being excited by visible light, which has wavelengths falling within the range of 300 nm to 500 nm, to produce the fluorescence having wavelengths of the visible region (400 nm to 700 nm). (Reference may be made to FIG. 7A and FIG. 15A.) Further, the inventors have found that each of the garnet type compound (1) and the garnet type compound (2) in accordance with the present invention is capable of being excited by ultraviolet light having a wavelength of at most 300 nm or by radiation to produce the fluorescence having wavelengths of the ultraviolet region to the visible region (250 nm to 700 nm). (Reference may be made to FIG. 8A and FIG. 15B.)

The Pr-doped inorganic compound in accordance with the present invention is also applicable to inorganic compounds other than the garnet type compounds. Specifically, examples of the Pr-doped inorganic compounds in accordance with the present invention, which are other than the garnet type compounds, include compounds (3) through (10) described below.

(3) A compound (3), which may be represented by General Formula (3):

$$(Al_{2-x-y}A2_xPr_y)O_3 \quad (3)$$

wherein each of A1, A2, and Pr represents the element at the A site,
A1 represents Gd, or A1 represents La and Gd,
A2 represents at least one kind of element selected from the group consisting of Y, Lu, and Sc,
x represents a number satisfying the condition $0 \leq x<2$,
y represents a number satisfying the condition $0<y \leq 2$,
provided that $0<x+y \leq 2$, and
O represents the oxygen atom.

(4) A C-rare earth type compound (4), which may be represented by General Formula (4):

$$(Al_{2-x-y}A2_xPr_y)_2O_3 \quad (4)$$

wherein each of A1, A2, and Pr represents the element at the A site,
A1 represents Gd, or A1 represents La and Gd,
A2 represents at least one kind of element selected from the group consisting of Y, Lu, and Sc,
x represents a number satisfying the condition $0 \leq x<2$,
y represents a number satisfying the condition $0<y \leq 2$,
provided that $0<x+y \leq 2$, and
O represents the oxygen atom.

(5) A perovskite type compound (5), which may be represented by General Formula (5):

$$(Al_{1-x-y}A2_xPr_y)BO_3 \quad (5)$$

wherein each of A1, A2, and Pr represents the element at the A site,
B represents the element at the B site,
A1 represents Gd, or A1 represents La and Gd,
A2 represents at least one kind of element selected from the group consisting of Y, Lu, and Sc, B represents at least one kind of element selected from the group consisting of Sc, Ga, and Al,
x represents a number satisfying the condition $0 \leq x < 1$,
y represents a number satisfying the condition $0 < y \leq 1$,
provided that $0 < x+y \leq 1$, and
O represents the oxygen atom.

(6) A compound (6), which may be represented by General Formula (6):

$$(Al_{4-x-y}A2_xPr_y)B_2O_9 \quad (6)$$

wherein each of A1, A2, and Pr represents the element at the A site,
B represents the element at the B site,
A1 represents at least one kind of element selected from the group consisting of La and Gd,
A2 represents at least one kind of element selected from the group consisting of Y, Lu, and Sc,
B represents at least one kind of element selected from the group consisting of Lu, Sc, Gd, and Al,
x represents a number satisfying the condition $0 \leq x < 4$,
y represents a number satisfying the condition $0 < y \leq 4$,
provided that $0 < x+y \leq 4$, and
O represents the oxygen atom.

(7) A compound (7), which may be represented by General Formula (7):

$$(Al_{1-x-y}A2_xPr_y)VO_4 \quad (7)$$

wherein each of A1, A2, and Pr represents the element at the A site,
A1 represents La, or A1 represents La and Gd,
A2 represents at least one kind of element selected from the group consisting of Y, Lu, and Sc,
x represents a number satisfying the condition $0 \leq x < 1$,
y represents a number satisfying the condition $0 < y \leq 1$,
provided that $0 < x+y \leq 1$,
V represents the vanadium atom, and
O represents the oxygen atom.

(8) A compound (8), which may be represented by General Formula (8):

$$(Al_{2-x-y}A2_xPr_y)BO_5 \quad (8)$$

wherein each of A1, A2, and Pr represents the element at the A site,
B represents the element at the B site,
A1 represents at least one kind of element selected from the group consisting of La and Gd,
A2 represents at least one kind of element selected from the group consisting of Y, Lu, and Sc,
B represents at least one kind of element selected from the group consisting of Si and Ge,
x represents a number satisfying the condition $0 \leq x < 2$,
y represents a number satisfying the condition $0 < y \leq 2$,
provided that $0 < x+y \leq 2$, and
O represents the oxygen atom.

(9) A compound (9), which may be represented by General Formula (9):

$$(Al_{2-x-y}A2_xPr_y)B_2O_7 \quad (9)$$

wherein each of A1, A2, and Pr represents the element at the A site,
B represents the element at the B site,
A1 represents at least one kind of element selected from the group consisting of La and Gd,
A2 represents at least one kind of element selected from the group consisting of Y, Lu, and Sc,
B represents at least one kind of element selected from the group consisting of Si and Ge,
x represents a number satisfying the condition $0 \leq x < 2$,
y represents a number satisfying the condition $0 < y \leq 2$,
provided that $0 < x+y \leq 2$, and
O represents the oxygen atom.

(10) A compound (10), which may be represented by General Formula (10):

$$(Al_{1-x-y}A2_xPr_y)PO_4 \quad (10)$$

wherein each of A1, A2, and Pr represents the element at the A site,
A1 represents at least one kind of element selected from the group consisting of La and Gd,
A2 represents at least one kind of element selected from the group consisting of Y, Lu, and Sc,
x represents a number satisfying the condition $0 \leq x < 1$,
y represents a number satisfying the condition $0 < y < 1$,
provided that $0 < x+y < 1$,
P represents the phosphorus atom, and
O represents the oxygen atom.

<Crystal Structure and Process for Production>

The Pr-doped inorganic compound in accordance with the present invention may have a single crystalline structure or a polycrystalline structure and may contain inevitable impurities. Also, the Pr-doped inorganic compound in accordance with the present invention should preferably be of a single phase as a whole. However, the Pr-doped inorganic compound in accordance with the present invention may contain a heterogeneous phase in a proportion within a range such that the characteristics of the Pr-doped inorganic compound may not be affected adversely. The Pr-doped inorganic compound in accordance with the present invention may take on a form of a bulk body, such as a pellet-shaped body, a disk-shaped body, or a rod-shaped body. Alternatively, the Pr-doped inorganic compound in accordance with the present invention may take on a form of a film, which has been formed on a base plate. As another alternative, the Pr-doped inorganic compound in accordance with the present invention may take on a form of particles.

In the cases of the Pr-doped inorganic compound having the single crystalline structure, the Pr-doped inorganic compound in accordance with the present invention may take on the form of a single crystal body having been caused to grow by use of a technique for growing a single crystal, such as a drawing-up technique (a Czochralski technique, a CZ technique), a melt seal drawing-up technique (an LEC technique), an EFG technique, a Bridgman's technique (a BS technique), a Verneuil technique, a floating zone technique (an FZ technique), a hydrothermal synthesis technique, a flux technique, or a micro drawing-down technique. Alternatively, the Pr-doped inorganic compound in accordance with the present invention may take on the form of a single crystal film, which has been formed by use of a vapor phase deposition technique, such as a vacuum evaporation technique or a sputtering technique.

In the cases of the Pr-doped inorganic compound having the polycrystalline structure, the Pr-doped inorganic compound in accordance with the present invention may take on the form of a polycrystal sintered body having been obtained from processing, in which raw material particles are molded into a predetermined shape and sintered. Alternatively, the Pr-doped inorganic compound in accordance with the present invention may take on the form of particles of the polycrystal sintered body, which particles have been obtained from grinding processing. As another alternative, the Pr-doped inorganic compound in accordance with the present invention may take on the form of a polycrystal particle precipitate, which has been obtained from a raw material solution through a precipitation reaction. As a further alternative, the Pr-doped inorganic compound in accordance with the present invention may take on the form of a polycrystal body having been obtained with a sol-gel technique. As a still further alternative, the Pr-doped inorganic compound in accordance with the present invention may take on the form of a polycrystal film, which has been formed by use of the vapor phase deposition technique, such as the vacuum evaporation technique or a sputtering technique.

When necessary, the single crystal body and the polycrystal body described above may be subjected to heat processing or mechanical processing, such as cutting or polishing, and may then be used.

The polycrystal body has the advantages over the single crystal body in that the flexibility in designing of the composition is high, in that the Pr doping at a high concentration is capable of being performed easily, and in that a compound having a composition, which is not capable of being formed with a single crystal, is capable of being produced. In particular, the polycrystal sintered body has the advantages in that the density is capable of being enhanced at a low cost, and in that the size is capable of being set to be large at a low cost.

In cases where the polycrystal sintered body of the Pr-doped inorganic compound in accordance with the present invention is to be utilized in use applications, such as a fluorescent substance for a white light emitting diode, a solid laser medium, a fiber amplifier, and a scintillator, it is necessary for the polycrystal sintered body to have the light transmissivity. Particularly, in cases where the polycrystal sintered body of the Pr-doped inorganic compound in accordance with the present invention is to be utilized in use applications, such as the solid laser medium and the fiber amplifier, the polycrystal sintered body should preferably be transparent to an extent such that substantial scattering may not occur.

In cases where the light transmissivity (the transparency) is taken into consideration, the polycrystal sintered body should preferably have a single phase structure.

Also, in cases where the light transmissivity (the transparency) is taken into consideration, the polycrystal sintered body should preferably have a cubic system crystal structure free from effects of birefringence. Specifically, of the above-enumerated compounds (1) to (10) in accordance with the present invention, the compounds having the cubic system crystal structure, more specifically the garnet type compound (1), the garnet type compound (2), and the C-rare earth type compound (4), are preferable. The C-rare earth type compound (4), which has a melting temperature higher than 2,000° C., suffers from restrictions on the production process. Also, it may often occur that the C-rare earth type compound (4) shifts to a non-cubic system crystal structure, such as an A-rare earth type crystal structure or a B-rare earth type crystal structure. Therefore, the polycrystal sintered body should particularly preferably be of the garnet type compound (1) or the garnet type compound (2).

The polycrystal sintered body should preferably have a high density equivalent to a stoichiometric density or have a shape, which is thin to an extent such that adverse effects of scattering do not occur.

[Luminescent Composition in Accordance with the Present Invention]

The luminescent composition in accordance with the present invention is characterized by containing the aforesaid Pr-doped inorganic compound in accordance with the present invention.

The luminescent composition in accordance with the present invention may also contain an arbitrary constituent other than the Pr-doped inorganic compound in accordance with the present invention.

By way of example, the luminescent composition in accordance with the present invention may take on the form of a dispersion, which contains a dispersing medium, such as a light transmissive resin (e.g., a (meth)acrylic resin), glass, water, or an organic solvent, and particles of the Pr-doped inorganic compound in accordance with the present invention having been dispersed in the dispersing medium. In order for the aforesaid dispersion to be produced, the particles of the Pr-doped inorganic compound in accordance with the present invention may firstly be produced and may then be dispersed in the dispersing medium. Alternatively, the particles of the Pr-doped inorganic compound in accordance with the present invention may be precipitated in the dispersing medium.

[Luminescent Body in Accordance with the Present Invention]

The luminescent body in accordance with the present invention is characterized by containing the aforesaid Pr-doped inorganic compound in accordance with the present invention and by being formed into a predetermined shape.

The luminescent body in accordance with the present invention may taken on the form of the single crystal body of the Pr-doped inorganic compound in accordance with the present invention. Alternatively, the luminescent body in accordance with the present invention may taken on the form of the polycrystal sintered body of the Pr-doped inorganic compound in accordance with the present invention. As another alternative, the luminescent body in accordance with the present invention may taken on the form of a molded body, which contains a solid medium, such as a light transmissive resin (e.g., a (meth) acrylic resin) or glass, and the particles of the Pr-doped inorganic compound in accordance with the present invention having been dispersed in the solid medium.

In cases where the light transmissivity (the transparency) is taken into consideration, in the cases of the molded body, which contains the solid medium and the particles of the Pr-doped inorganic compound in accordance with the present invention having been dispersed in the solid medium, the mean particle diameter of the particles of the Pr-doped inorganic compound in accordance with the present invention should preferably be sufficiently smaller than the wavelengths of light. The mean particle diameter of the particles of the Pr-doped inorganic compound in accordance with the present invention should more preferably be at most 100 nm, and should particularly preferably be at most several tens of nanometers.

The luminescent body in accordance with the present invention may have an arbitrary shape. For example, the luminescent body in accordance with the present invention may have a pellet-like shape, a disk-like shape, or a rod-like shape. In the cases of the luminescent body, which contains the solid medium and the particles of the Pr-doped inorganic compound in accordance with the present invention having been dispersed in the solid medium, the luminescent body in accordance with the present invention may have a fiber-like shape.

[Light Emitting Device in Accordance with the Present Invention]

The light emitting device in accordance with the present invention comprises:

i) the luminescent body in accordance with the present invention, and ii) the exciting light source for producing the exciting light to be irradiated to the luminescent body.

An embodiment of the light emitting device in accordance with the present invention will be described hereinbelow with reference to FIG. 1. FIG. 1 is a sectional view showing an embodiment of the light emitting device in accordance with the present invention, the view being taken in a thickness direction of a circuit base plate 2.

As illustrated in FIG. 1, a light emitting device 1, which is an embodiment of the light emitting device in accordance with the present invention, comprises the circuit base plate 2 having a circular disk-like shape. The light emitting device 1 in accordance with the present invention also comprises a light emitting element 3 acting as the exciting light source. The light emitting element 3 is located at the middle of the surface of the circuit base plate 2. The light emitting device 1 in accordance with the present invention further comprises a dome-shaped luminescent body 5, which has been molded on the circuit base plate 2 so as to surround the light emitting element 3.

The light emitting element 3 for producing the exciting light to be utilized for exciting the luminescent body 5 is constituted of a semiconductor light emitting diode, or the like. The light emitting element 3 is electrically connected to the circuit base plate 2 by a bonding wire 4.

In this embodiment, the luminescent body 5 is constituted of the molded body having been obtained from the processing, wherein the particles of the polycrystal sintered body of the Pr-doped inorganic compound in accordance with the present invention, such as Pr:LLGG or Pr:LSGG, which particles have been obtained from grinding processing, are dispersed in a light transmissive resin, such as a (meth) acrylic resin.

In this embodiment, the luminescent body 5 may be prepared in the manner described below. Specifically, the polycrystal sintered body of the Pr-doped inorganic compound in accordance with the present invention is subjected to the grinding processing in a mortar, and the particles of the aforesaid polycrystal sintered body are thereby obtained. Thereafter, the particles having been obtained from the grinding processing are subjected to kneading processing together with a light transmissive resin, such as a (meth) acrylic resin, in a resin melt state. From the kneading processing, a mixture of the particles of the polycrystal sintered body of the Pr-doped inorganic compound in accordance with the present invention and the light transmissive resin (in a proportion of, e.g., Pr-doped inorganic compound: light transmissive resin=3:4 (mass ratio)) is obtained. The circuit base plate 2, on which the light emitting element 3 has been located, is then located in a mold, and the aforesaid mixture is subjected to injection molding and molded on the circuit base plate 2.

Each of Pr:LLGG and Pr:LSGG is capable of being excited by light, which has wavelengths falling within the range of 300 nm to 500 nm, to produce the fluorescence having wavelengths of the visible region (400 nm to 700 nm). Also, each of Pr:LLGG and Pr:LSGG is capable of being excited by ultraviolet light having a wavelength of at most 300 nm or by radiation to produce the fluorescence having wavelengths of the ultraviolet region to the visible region (250 nm to 700 nm). Therefore, the exciting light source may be selected in accordance with the desired wavelengths of the luminescence.

The light emitting element 3 acting as the exciting light source should preferably be constituted of, for example, a nitride type of semiconductor light emitting diode (oscillation peak wavelength: 360 nm to 500 nm) provided with an active layer, which contains at least one kind of nitrogen-containing semiconductor compound, such as GaN, AlGaN, InGaN, InGaNAs, or GaNAs; a ZnSSe type of semiconductor light emitting diode (oscillation peak wavelength: 450 nm to 520 nm); or a ZnO type of semiconductor light emitting diode (oscillation peak wavelength: 360 nm to 450 nm).

In this embodiment, the luminescent body 5 produces the luminescence of a color tone different from the color tone of the light radiated out from the light emitting element 3. As a result, light, which is of the mixed color of the light radiated out from the light emitting element 3 and the luminescence produced by the luminescent body 5, is radiated out from the light emitting device 1.

This embodiment of the light emitting device 1 is provided with the luminescent body 5, which contains the Pr-doped inorganic compound in accordance with the present invention. Therefore, this embodiment of the light emitting device 1 has good luminescence characteristics, such as the fluorescence intensity. The light emitting device 1 is capable of being utilized appropriately as a white light emitting diode, and the like.

[Solid Laser Device in Accordance with the Present Invention]

The solid laser device in accordance with the present invention comprises:

i) the solid laser medium constituted of the luminescent body, which contains the Pr-doped inorganic compound in accordance with the present invention, and ii) the exciting light source for producing the exciting light to be irradiated to the solid laser medium.

An embodiment of the solid laser device in accordance with the present invention will be described herein below with reference to FIG. 2A.

As illustrated in FIG. 2A, a solid laser device 10, which is an embodiment of the solid laser device in accordance with the present invention, is constituted as a laser diode pumped solid laser device. The laser diode pumped solid laser device comprises a solid laser medium 13 constituted of the luminescent body containing the compound in accordance with the present invention. The solid laser device 10 also comprises a semiconductor laser diode 11 acting as an exciting light source (in this case, a pumping light source) for producing the exciting light (in this case, the pumping light) to be irradiated to the solid laser medium 13.

Also, a converging lens 12 is located between the semiconductor laser diode 11 and the solid laser medium 13. Further, an output mirror 14 is located at the stage after the solid laser medium 13.

An exciting light incidence surface 13a of the solid laser medium 13 is provided with a coating layer, which transmits light having wavelengths falling within the excitation wavelength range, and which reflects light having output wavelengths. Also, a light incidence surface 14a of the output mirror 14 is provided with a coating layer, which transmits part of the light having the output wavelengths, and which reflects light having the other wavelengths. A resonator structure is constituted between the exciting light incidence surface 13a of the solid laser medium 13 and the light incidence surface 14a of the output mirror 14.

In this embodiment, the solid laser medium 13 is constituted of a single crystal body or a polycrystal sintered body of the Pr-doped inorganic compound in accordance with the present invention, such as Pr:LLGG or Pr:LSGG, which body has good transparency characteristics.

Each of Pr:LLGG and Pr:LSGG is capable of being excited by light, which has wavelengths falling within the range of 300 nm to 500 nm, to produce the fluorescence having wavelengths of the visible region (400 nm to 700 nm). Also, each of Pr:LLGG and Pr:LSGG is capable of being excited by ultraviolet light having a wavelength of at most 300 nm or by radiation to produce the fluorescence having wavelengths of the ultraviolet region to the visible region (250 nm to 700 nm). Therefore, the exciting light source may be selected in accordance with the desired wavelengths of the luminescence.

The semiconductor laser diode 11 acting as the exciting light source should preferably be constituted of, for example, a nitride type of semiconductor laser diode (oscillation peak wavelength: 360 nm to 500 nm) provided with an active layer, which contains at least one kind of nitrogen-containing semiconductor compound, such as GaN, AlGaN, InGaN, InGaNAs, or GaNAs; a ZnSSe type of semiconductor laser diode (oscillation peak wavelength: 450 nm to 520 nm); or a ZnO type of semiconductor laser diode (oscillation peak wavelength: 360 nm to 450 nm).

With this embodiment of the solid laser device 10, the solid laser medium 13 is excited (pumped) by the semiconductor laser diode 11 and produces a laser beam having wavelengths falling within a wavelength distribution range different from the wavelength distribution range of the exciting light.

With this embodiment of the solid laser device 10, the wavelengths of the output laser beam are capable of being altered by, for example, an alteration of each of the coating layer, which is formed on the exciting light incidence surface 13a of the solid laser medium 13, and the coating layer, which is formed on the light incidence surface 14a of the output mirror 14. The wavelengths of the output laser beam are also capable of being altered by an alteration of the exciting light source.

The aforesaid embodiment of the solid laser device 10 is provided with the solid laser medium 13 containing the Pr-doped inorganic compound in accordance with the present invention. Therefore, with the solid laser device 10, a laser beam having a high luminance is capable of being obtained.

(Examples of Design Modification)

The solid laser device in accordance with the present invention is not limited to the embodiment described above, and the device constitution may be modified in various ways. For example, as illustrated in FIG. 2B, an optical wavelength converting element 15, such as a nonlinear optical crystal body, may be located between the solid laser medium 13 and the output mirror 14. With the constitution illustrated in FIG. 2B, the laser beam having been produced by the solid laser medium 13 is capable of being subjected to wavelength conversion (wavelength shortening) for yielding a second harmonic, or the like. The optical wavelength converting element 15 maybe located within the resonator structure or may be located on the side outward from the resonator structure.

The aforesaid embodiment of the solid laser device 10 is constituted as an end pump type of solid laser device. However, the solid laser device in accordance with the present invention is also applicable to a side pump type of solid laser device.

[Fiber Laser, Fiber Amplifier]

A fine particle dispersion, which contains a dispersing medium constituted of an optical fiber material, such as an $SiO_2$ type of glass, a fluoride type of glass, a chalcogenide type of glass, or a (meth) acrylic resin, and fine particles of the Pr-doped inorganic compound in accordance with the present invention having been dispersed in the dispersing medium, is capable of being obtained with processing, in which the fine particles of the Pr-doped inorganic compound in accordance with the present invention are precipitated in the dispersing medium. The thus obtained fine particle dispersion may be utilized as a core material. In this manner, a Pr-doped optical fiber, which is provided with a core containing the Pr-doped inorganic compound in accordance with the present invention, is capable of being obtained.

The Pr-doped optical fiber may then be connected to at least one exciting light source, such as a semiconductor laser diode. In this manner, a fiber laser or a fiber amplifier is capable of being constituted. With the fiber laser or the fiber amplifier, in which the Pr-doped optical fiber containing the Pr-doped inorganic compound in accordance with the present invention is utilized, light having a high luminance is capable of being obtained.

[Ionizing Radiation Detecting Device in Accordance with the Present Invention]

The ionizing radiation detecting device in accordance with the present invention comprises:

i) the scintillator constituted of the luminescent body, which contains the Pr-doped inorganic compound in accordance with the present invention, and ii) the scintillation photodetector for detecting the light, which has been radiated out from the scintillator.

Examples of the scintillation photodetectors include a photodiode, a photomultiplier, and a CCD image sensor. The ionizing radiation may be X-rays, γ-rays, or the like.

The ionizing radiation detecting device in accordance with the present invention, which is provided with the scintillator containing the Pr-doped inorganic compound in accordance with the present invention, is capable of enhancing the optical intensity of the light radiated out from the scintillator and is capable of enhancing the sensitivity.

When necessary, the ionizing radiation detecting device in accordance with the present invention may be combined with an ionizing radiation source (e.g., an X-ray source), a computer for data processing, and the like. In this manner, a tomographic apparatus, or the like, is capable of being constituted.

An example of a positron emission tomographic apparatus (PET) will be described hereinbelow with reference to FIGS. 3A, 3B, and 3C. In FIGS. 3A and 3B, a reference numeral 40 represents an object. The cases wherein the object 40 is a human body will be described hereinbelow.

FIG. 3A is an explanatory view showing an example of a positron emission tomographic apparatus 20 provided with an embodiment of the ionizing radiation detecting device in accordance with the present invention, the view being taken from the side of the head of the object 40. FIG. 3B is an explanatory view showing the positron emission tomographic apparatus 20 of FIG. 3A, the view being taken from the lateral side of the object 40. FIG. 3C is an explanatory view showing array patterns of scintillators 23, 23, . . . and photomultipliers 24, 24, which constitute one block of a γ-ray detecting device 22 in the positron emission tomographic apparatus 20 of FIG. 3A.

The tomography utilizing the positron emission tomographic apparatus 20 is performed in the manner described below. Specifically, a positron emitting agent, such as fluorodeoxy-glucose, is administered to the object 40, and positrons are generated within the object 40. Also, γ-rays 25 occurring from the positrons are detected, and a tomographic image is thereby obtained.

The positron emission tomographic apparatus 20 comprises γ-ray detecting unit 21. The γ-ray detecting unit 21 is provided with a plurality of the γ-ray detecting devices (acting as the ionizing radiation detecting devices) 22, 22, ..., which are arrayed in a ring-like pattern and are formed into a unit. The positron emission tomographic apparatus 20 also comprises a computer for data processing (not shown).

The object 40 is located at the center point of the γ-ray detecting unit 21 and is capable of being moved for scanning in a body axis direction D (shown in FIG. 3B) and with respect to the γ-ray detecting unit 21.

The γ-ray detecting unit 21 has the constitution, such that the plurality of the γ-ray detecting devices 22, 22, ... are arrayed in the approximately annular pattern, and such that a plurality of units, each of which is constituted of the plurality of the γ-ray detecting devices 22, 22, ... arrayed in the approximately annular pattern, are arrayed so as to stand side by side with one another with respect to the body axis direction D of the object 40. The number of the γ-ray detecting devices 22, 22, ... and the array pattern of the γ-ray detecting devices 22, 22, ... may be designed arbitrarily. For example, the γ-ray detecting devices 22, 22, ... may be arrayed in an array pattern of 100 blocks arrayed so as to stand side by side with one another with respect to the circumferential direction×5 blocks arrayed so as to stand side by side with one another with respect to the body axis direction D. (In FIGS. 3A and 3B, the array pattern of the γ-ray detecting devices 22, 22, ... is simplified for clearness.)

With the positron emission tomographic apparatus 20, the γ-rays 25, which are emitted toward the 360° directions from the object 40 when the object 40 takes a certain position with respect to the γ-ray detecting unit 21 and with respect to the body axis direction D, are detected by the γ-ray detecting unit 21, which contains the plurality of the γ-ray detecting devices 22, 22, ... arrayed in the circumferential direction. In this manner, the tomographic image of the object 40 at the aforesaid certain position is capable of being obtained. At this time, by way of example, the number of the objective planes, the images of which are detected, is 2,500 planes. The object 40 is moved for the scanning in the body axis direction D and with respect to the γ-ray detecting unit 21, and the detecting operations are performed in the manner described above. As a result, a three-dimensional tomographic image is capable of being obtained.

Figure 3C:
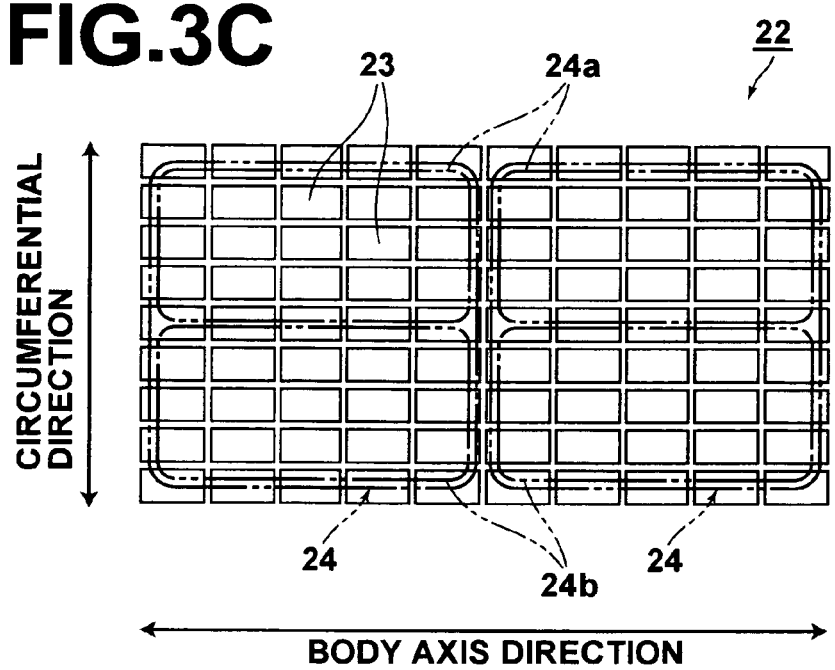
FIG. 3C is an explanatory view showing array patterns of scintillators and photomultipliers, which constitute one block of a γ-ray detecting device in the positron emission tomographic apparatus of FIG. 3A.

As illustrated in FIGS. 3B and 3C, each of the γ-ray detecting devices 22, 22, ... (i.e., one block of the γ-ray detecting device 22) comprises a plurality of the scintillators 23, 23, ..., each of which is constituted of the luminescent body containing the Pr-doped inorganic compound in accordance with the present invention. Each of the γ-ray detecting devices 22, 22, ... also comprises the photomultipliers (acting as the scintillation photodetectors) 24, 24 for detecting the light radiated out from the scintillators 23, 23, With the positron emission tomographic apparatus 20, the light having wavelengths falling within the range of the ultraviolet region to the visible region, which light is generated by the scintillators 23, 23, ... when the γ-rays 25 impinge upon the scintillators 23, 23, ..., is converted by the photomultipliers 24, 24, ... into an electric signal and is detected by the photomultipliers 24, 24, ...

The number of the scintillators 23, 23, ..., which constitute each of the γ-ray detecting devices 22, 22, ..., and the array pattern of the scintillators 23, 23, ... may be designed arbitrarily. Also, the number of the photomultipliers 24, 24, ..., which constitute each of the γ-ray detecting devices 22, 22, ..., and the array pattern of the photomultipliers 24, 24, ... may be designed arbitrarily. In the example illustrated in FIG. 3C, each of the γ-ray detecting devices 22, 22, ... (i.e., one block of the γ-ray detecting device 22) comprises an array of nine scintillators 23, 23, ... arrayed so as to stand side by side with one another with respect to the circumferential direction×ten scintillators 23, 23, ... arrayed so as to stand side by side with one another with respect to the body axis direction D. Also, in the example illustrated in FIG. 3C, each of the γ-ray detecting devices 22, 22, ... (i.e., one block of the γ-ray detecting device 22) comprises two photomultipliers 24, 24 arrayed so as to stand side by side with each other with respect to the body axis direction D. Each of the photomultipliers 24, 24 contains two square type elements 24a and 24b. The photomultipliers 24, 24 are located on the side more radially outward than the scintillators 23, 23, ..., as viewed from the position of the object 40, such that the photomultipliers 24, 24 may cover approximately the entire areas of the plurality of the corresponding scintillators 23, 23, ... (In FIG. 3B, the array pattern is simplified for clearness.)

Figure 4A:
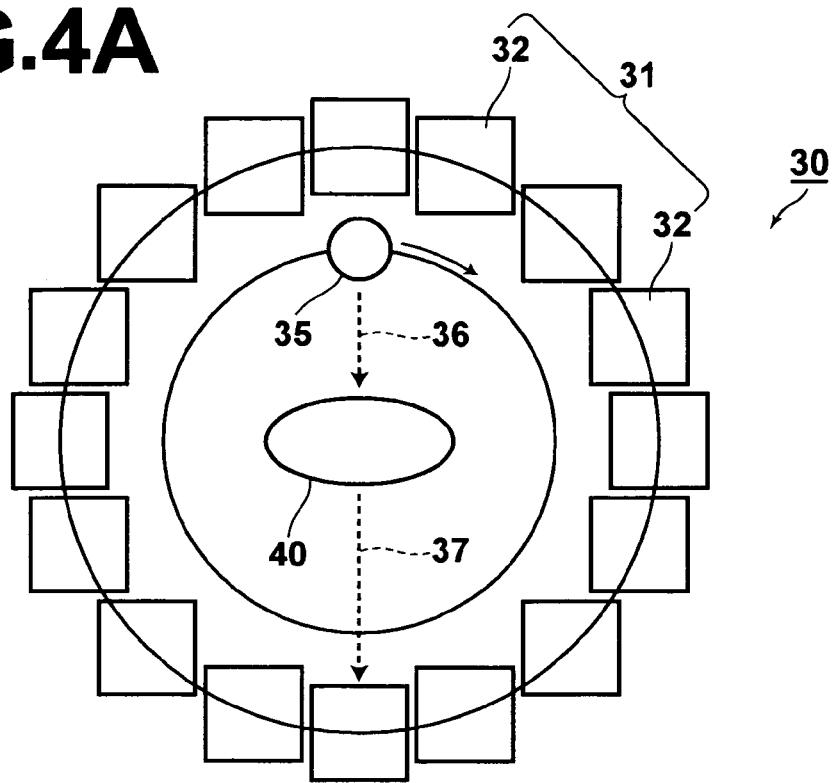
FIG. 4A is an explanatory view showing an example of an X-ray tomographic apparatus provided with an embodiment of the ionizing radiation detecting device in accordance with the present invention, the view corresponding to FIG. 3A.

An example of an X-ray tomographic apparatus will be described hereinbelow with reference to FIG. 4A. FIG. 4A is a view corresponding to FIG. 3A. In FIG. 4A, similar elements are numbered with the same reference numerals with respect to FIG. 3A.

With reference to FIG. 4A, an X-ray tomographic apparatus 30 comprises an X-ray detecting unit 31. The X-ray detecting unit 31 is provided with a plurality of X-ray detecting devices (acting as the ionizing radiation detecting devices) 32, 32, ..., which are arrayed in a ring-like pattern and are formed into a unit. The X-ray tomographic apparatus 30 also comprises a computer for data processing (not shown).

The object 40 is located at the center point of the X-ray detecting unit 31 and is capable of being moved for scanning in the body axis direction and with respect to the X-ray detecting unit 31.

The X-ray detecting unit 31 has the constitution, such that the plurality of the X-ray detecting devices 32, 32, ... are arrayed in the approximately annular pattern, and such that a plurality of units, each of which is constituted of the plurality of the X-ray detecting devices 32, 32, ... arrayed in the approximately annular pattern, are arrayed so as to stand side by side with one another with respect to the body axis direction of the object 40. The number of the X-ray detecting devices 32, 32, ... and the array pattern of the X-ray detecting devices 32, 32, ... may be designed arbitrarily. For example, the X-ray detecting devices 32, 32, ... may be arrayed in an array pattern of 100 blocks arrayed so as to stand side by side with one another with respect to the circumferential direction×5 blocks arrayed so as to stand side by side with one another with respect to the body axis direction. (In FIG. 4A, the array pattern of the X-ray detecting devices 32, 32, ... is simplified for clearness.)

Also, an X-ray source 35 for rotation in the circumferential direction is located between the X-ray detecting unit 31 and the object 40.

With the X-ray tomographic apparatus 30, X-rays 36 are produced by the X-ray source 35 and are irradiated to the object 40. X-rays 37, which have passed through the object 40, are detected by the X-ray detecting device 32 located on the side of the object 40, which side is opposite to the side that stands facing the X-ray source 35. At the time at which the object 40 takes a certain position with respect to the X-ray source 35 and the X-ray detecting unit 31 and with respect to the body axis direction, the X-ray source 35 is moved along the circumferential direction, and the X-rays 37 having passed through the object 40 are detected by the X-ray detecting unit 31, which contains the plurality of the X-ray detecting devices 32, 32, ... arrayed in the circumferential direction. In this manner, a tomographic image of the object 40 at the aforesaid certain position is capable of being obtained.

The object 40 is moved for the scanning in the body axis direction and with respect to the X-ray detecting unit 31 and the X-ray source 35, and the detecting operations are performed in the manner described above. As a result, a three-dimensional tomographic image is capable of being obtained.

Each of the X-ray detecting devices 32, 32, . . . (i.e., one block of the X-ray detecting device 32) has the constitution basically identical with the constitution of each of the γ-ray detecting devices 22, 22, . . . of the positron emission tomographic apparatus 20 illustrated in FIGS. 3B and 3C. Specifically, each of the X-ray detecting devices 32, 32, . . . comprises a plurality of the scintillators (not shown), each of which is constituted of the luminescent body containing the Pr-doped inorganic compound in accordance with the present invention. Each of the X-ray detecting devices 32, 32, . . . also comprises the photomultipliers (acting as the scintillation photodetectors) (not shown) for detecting the light radiated out from the scintillators. (Reference may be made to FIGS. 3B and 3C.)

Figure 4B:
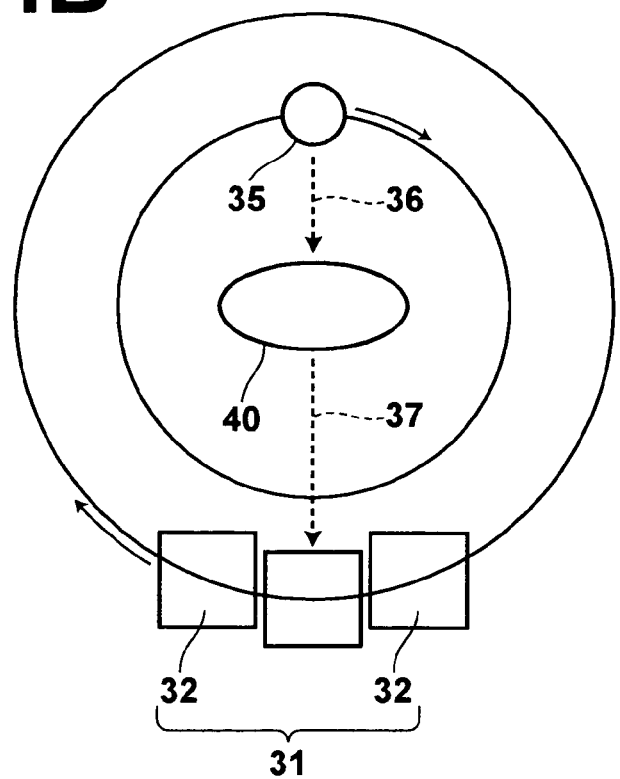
FIG. 4B is an explanatory view showing a modification of the X-ray tomographic apparatus of FIG. 4A.

As illustrated in FIG. 4B, the X-ray tomographic apparatus 30 may be modified such that the number of the X-ray detecting devices 32, 32, . . . is reduced, and such that the X-ray detecting devices 32, 32, 32 constituting an X-ray detecting unit 31' are moved in the circumferential direction in the manner interlocked with the X-ray source 35.

With each of the positron emission tomographic apparatus 20 illustrated in FIGS. 3A, 3B, and 3C, the X-ray tomographic apparatus 30 illustrated in FIG. 4A, and the modification of the X-ray tomographic apparatus 30 illustrated in FIG. 4B, which are provided with the ionizing radiation detecting devices in accordance with the present invention, tomographic images are capable of being acquired with a high sensitivity.

Besides the use applications described above, the Pr-doped inorganic compound in accordance with the present invention, the luminescent composition in accordance with the present invention, and the luminescent body in accordance with the present invention are capable of being utilized in a wide variety of other use applications.

EXAMPLES

The present invention will further be illustrated by the following nonlimitative examples.

Example 1

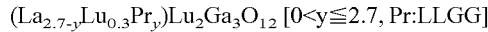
$(La_{2.7-y}Lu_{0.3}Pr_y)Lu_2Ga_3O_{12}$ [$0<y\leq2.7$, Pr:LLGG]

Each of polycrystal sintered bodies of a garnet type compound (1) (Pr: LLGG) in accordance with the present invention, which compound may be represented by General Formula (1), wherein A1 represents La, A2 represents Lu, B represents Lu, and C represents Ga, was prepared in the manner described below. As the polycrystal sintered bodies, 13 kinds of samples were prepared with processing, wherein the value of x in General Formula (1) was fixed at 0.3, and the value of y in General Formula (1) was set at various different values of 0.003, 0.009, 0.018, 0.03, 0.06, 0.09, 0.15, 0.21, 0.30, 0.60, 0.90, 1.35, and 2.7.

Specifically, firstly, $La_2O_3$ particles (purity: 99.99%), $Lu_2O_3$ particles (purity: 99.99%), $Ga_2O_3$ particles (purity: 99.99%), and $Pr_6O_{11}$ particles (purity: 99.99%) were prepared in proportions such that a desired composition might be obtained. The composition of the raw material particles was set such that, for example, in the cases of y=0.03, the quantity of the $La_2O_3$ particles was 43.496 g, the quantity of the $Lu_2O_3$ particles was 45.762 g, the quantity of the $Ga_2O_3$ particles was 28.117 g, and the quantity of the $Pr_6O_{11}$ particles was 0.511 g.

The raw material particles described above, 100 ml of ethanol, and alumina balls for mixing were put into a pot mill and were subjected to wet mixing processing for 12 hours. Thereafter, the alumina balls were removed, and ethanol was removed from the resulting mixed particle slurry by use of a rotary evaporator. The mixed particles were then dried at a temperature of 100° C. for 12 hours. The resulting dry particles were slightly unfastened in a mortar. Thereafter, approximately 1.3 g of the thus obtained dry particles were subjected to uniaxial compression molding processing at a molding pressure of 100 MPa and were thus molded into a pellet (a circular cylinder-shaped pellet) having a diameter of 10 mm. (The height of the pellet was set at a value appropriate for each of the samples.)

The compression molded body having thus been obtained was subjected to a preliminary firing process in an electric furnace under an air atmosphere. Specifically, with the preliminary firing process, the temperature of the compression molded body was raised to 1,450° C. at a temperature rise rate of 500° C./hr and was kept at 1,450° C. for two hours, and the compression molded body was then cooled to a temperature of 1,000° C. at a temperature fall rate of 500° C./hr and was then subjected to natural furnace cooling.

After the preliminarily sintered body had cooled to normal temperatures, the preliminarily sintered body was subjected to grinding processing by use of an alumina mortar and an alumina pestle. The resulting particles of the preliminarily sintered body were again subjected to the uniaxial compression molding processing at a molding pressure of 100 MPa and were thus molded into a pellet (a circular cylinder-shaped pellet) having a diameter of 10 mm. (The height of the pellet was set at a value appropriate for each of the samples.)

The recompression molded body having thus been obtained was then subjected to a final firing process in the electric furnace under an air atmosphere. Specifically, with the final firing process, the temperature of the recompression molded body was raised to 1,550° C. at a temperature rise rate of 500° C./hr and was kept at 1,550° C. for two hours, and the recompression molded body was then cooled to a temperature of 1,000° C. at a temperature fall rate of 500° C./hr and was then subjected to natural furnace cooling. In this manner, each of the polycrystal sintered bodies (Pr: LLGG) having the compositions described above was prepared.

Comparative Example 1

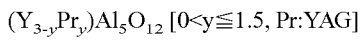
$(Y_{3-y}Pr_y)Al_5O_{12}$ [$0<y\leq1.5$, Pr:YAG]

Each of polycrystal sintered bodies of a compound $(Y_{3-y}Pr_y)Al_5O_{12}$ [$0<y\leq1.5$, Pr:YAG] was prepared in the same manner as that in Example 1, except that the raw material particles were altered to $Y_2O_3$ particles (purity: 99.9%), $\alpha$-$Al_2O_3$ particles (purity: 99.99%), and $Pr_6O_{11}$ particles (purity: 99.99%), and except that the firing temperature in the final firing process was set at 1,750° C. As the polycrystal sintered bodies, eight kinds of samples were prepared with processing, wherein the value of y was set at various different values of 0.009, 0.015, 0.024, 0.03, 0.06, 0.09, 0.30, and 1.5.

The composition of the raw material particles was set such that, for example, in the cases of y=0.03, the quantity of the $Y_2O_3$ particles was 35.533 g, the quantity of the $\alpha$-$Al_2O_3$ particles was 25.490 g, and the quantity of the $Pr_6O_{11}$ particles was 0.511 g.

Evaluation of Example 1 and Comparative Example 1

<Powder X-ray Diffraction (XRD) Measurement>

As for each of the samples of the polycrystal sintered bodies of Pr:LLGG (x=0.3, 0<y≦2.7) having been prepared in Example 1, the prepared poly crystal sintered body was subjected to grinding processing by use of an alumina mortar and an alumina pestle and was then subjected to powder X-ray diffraction (XRD) measurement with an X-ray diffraction apparatus (supplied by Rigaku Co.). Sample identification was thus performed. As for every sample, it was confirmed that the diffraction peak approximately coincided with the known diffraction peak of a $(La_{2.7}Lu_{0.3})Lu_2Ga_3O_{12}$ [non-doped LLGG] cubic system crystal (Journal of Solid State Chemistry, 8, 357 (1973), PDF#27-0227), and that the sample had the single phase structure.

Figure 5:
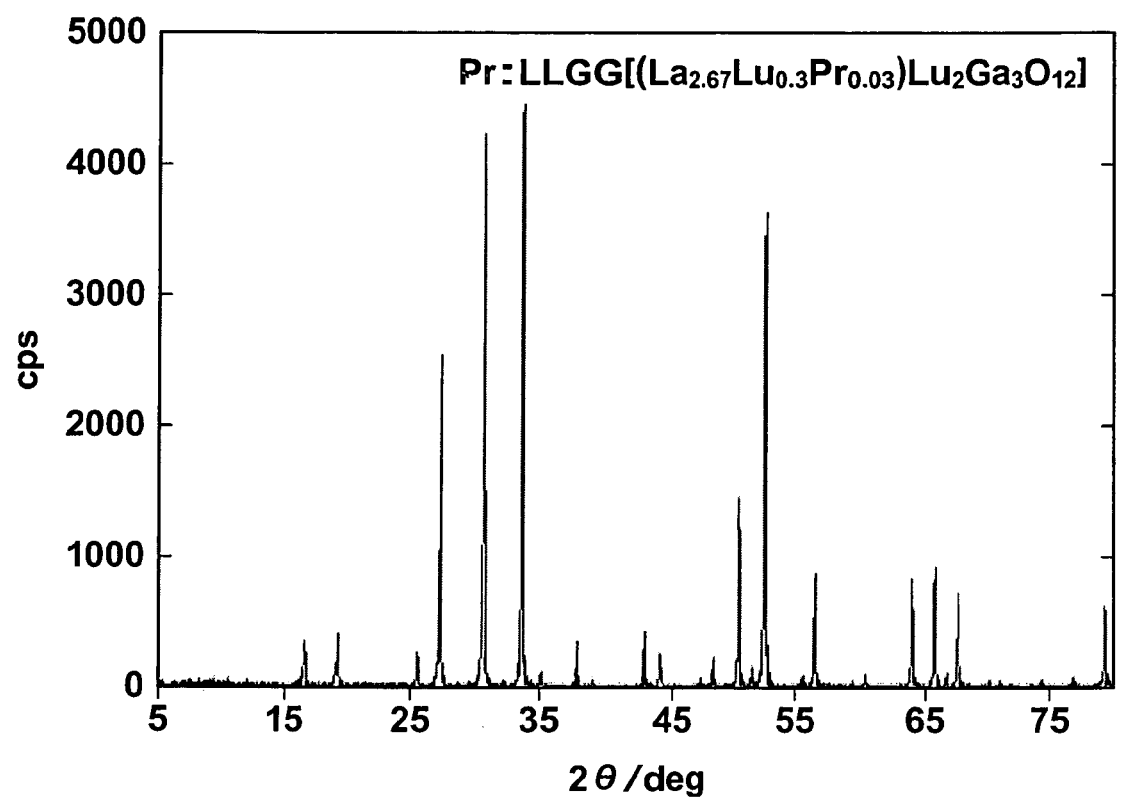
FIG. 5 is a graph showing an XRD pattern of Pr:LLGG having been prepared in Example 1.

It was thus revealed that, in the cases of the samples of Pr:LLGG having been prepared in Example 1, over the entire range of 0<y≦2.7, all of Pr, which had been loaded, entered into the matrix oxide, and La at the A site was appropriately substituted by Pr through the formation of the solid solution. As a typical example, FIG. 5 shows an XRD pattern of Pr:LLGG $[(La_{2.67}Lu_{0.3}Pr_{0.03})Lu_2Ga_3O_{12}]$, which had been prepared in Example 1, and in which y=0.03.

As for Pr:YAG having been prepared in Comparative Example 1, the XRD measurement was made in the same manner as that described above. It was confirmed that, in the cases of each of the samples of Pr:YAG, wherein y fell within the range of 1<y<0.3, the diffraction peak approximately coincided with the known diffraction peak of a YAG cubic system crystal, and that the sample had the single phase structure. However, it was revealed that, in the cases of each of the samples of Pr:YAG, wherein y=0.3 and y=1.5, a diffraction peak of a $PrAlO_3$ rhombohedral system crystal was found in addition to the diffraction peak of the YAG cubic system crystal, and it was thus revealed that each of the samples of Pr:YAG, wherein y=0.3 and y=1.5, contained a heterogeneous phase. The foregoing indicates that, as for Pr:YAG, in cases where the Pr doping concentration is higher than a certain range, a part of Pr having been loaded is not capable of entering into the matrix oxide due to the large ionic radius of $Pr^{3+}$ ions and is present as $PrAlO_3$.

<Lattice Constant>

Figure 6A:
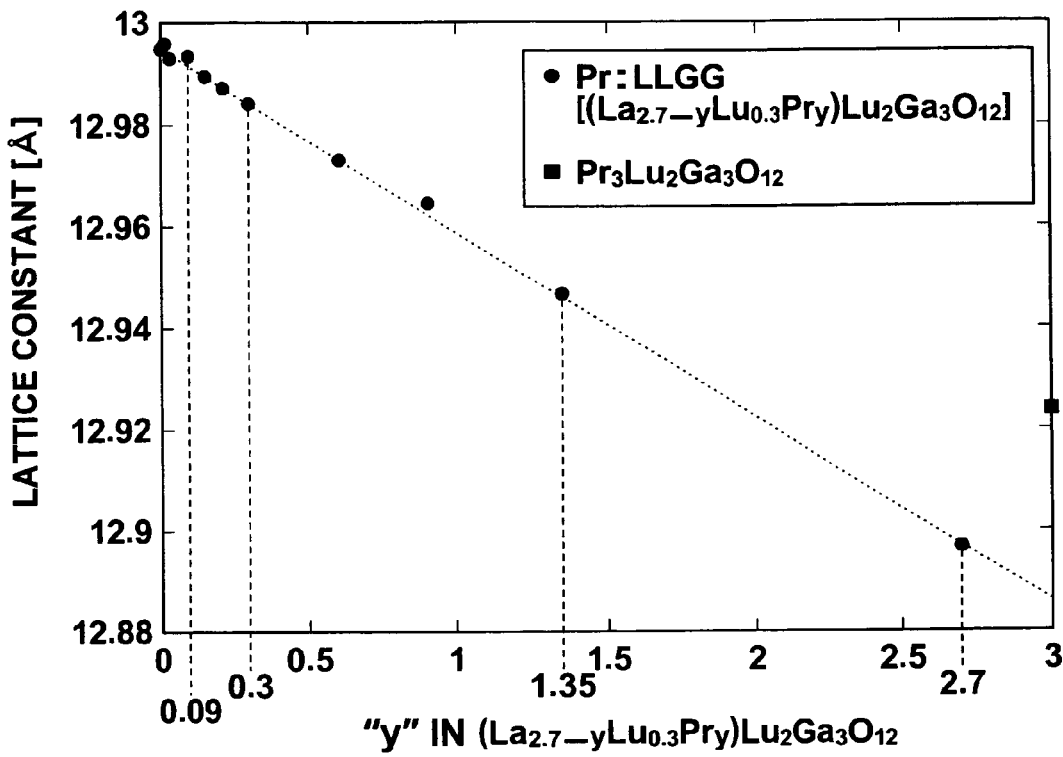
FIG. 6A is a graph showing a relationship between a number of mols of Pr "y" in Pr:LLGG having been prepared in Example 1 and a lattice constant of Pr:LLGG having been prepared in Example 1.
Figure 6B:
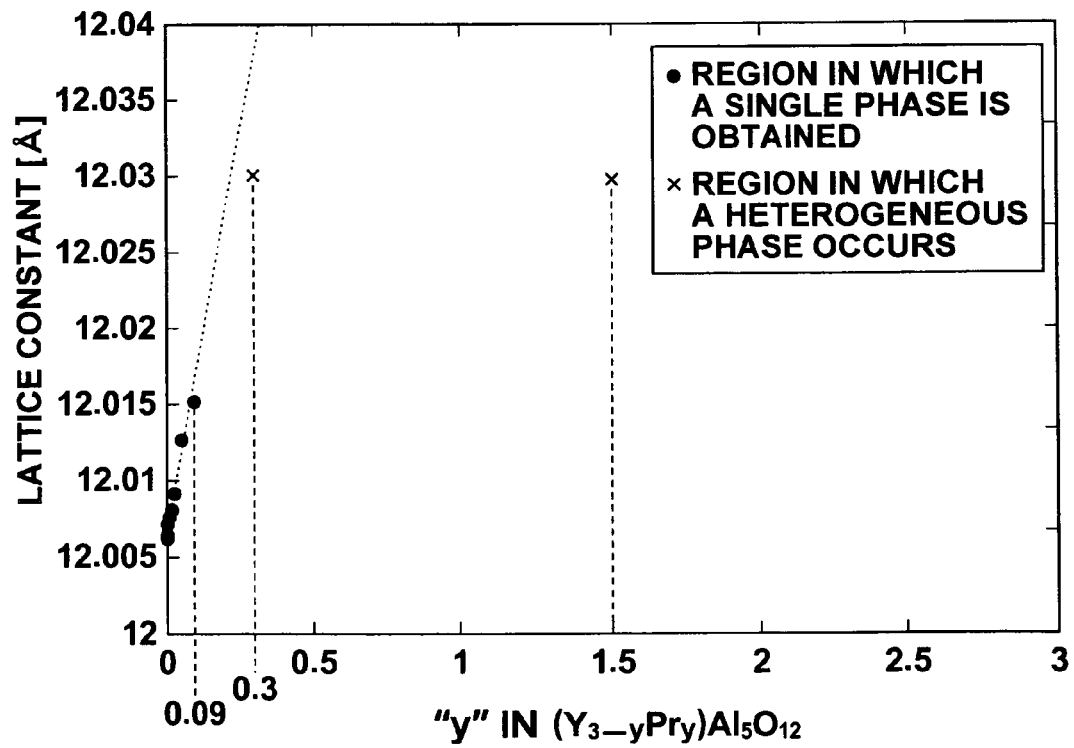
FIG. 6B is a graph showing the relationship between the number of mols of Pr "y" in Pr:YAG having been prepared in Comparative Example 1 and the lattice constant of Pr:YAG having been prepared in Comparative Example 1.

As for each of the samples of the polycrystal sintered bodies having been prepared in Example 1 and Comparative Example 1, the lattice constant was calculated in accordance with the results of the XRD measurement described above. Specifically, a diffraction peak value at 2θ=100° to 150° was obtained by use of the tangential method, and an accurate lattice constant was calculated by use of the Nelson-Riley function. From the calculations, the lattice constants as illustrated in FIGS. 6A and 6B were obtained. FIG. 6A is a graph showing the relationship between the number of mols of Pr "y" in Pr:LLGG having been prepared in Example 1 and the lattice constant of Pr:LLGG having been prepared in Example 1. FIG. 6B is a graph showing the relationship between the number of mols of Pr "y" in Pr:YAG having been prepared in Comparative Example 1 and the lattice constant of Pr:YAG having been prepared in Comparative Example 1.

As for the samples of $(La_{2.7-y}Lu_{0.3}Pr_y)Lu_2Ga_3O_{12}$ [0<y≦2.7, Pr:LLGG] having been prepared in Example 1, it was revealed that, over the entire range of 0<y≦2.7, the Vegard's law, which represents that the lattice constant alters approximately linearly with respect to an increase in number of mols of Pr "y," obtained. It was thus revealed that, over the entire range of 0<y≦2.7, and all of Pr, which had been loaded, entered into the matrix oxide, and La at the A site was appropriately substituted by Pr through the formation of the solid solution. The foregoing indicated that Pr is capable of being doped at an arbitrary doping concentration, and that it is also possible for all of La at the A site to be appropriately substituted by Pr through the formation of the solid solution (y=2.7 in cases where all of La at the A site has been substituted by Pr through the formation of the solid solution).

The approximately linear alteration of the lattice constant in accordance with the Vegard's law indicates that Pr having been doped and the matrix compound are well matched with each other. Also, the approximately linear alteration of the lattice constant in accordance with the Vegard's law indirectly indicates that, in the cases of the Pr doping at a high doping concentration, little lattice strain and little lattice defect arise in the vicinity of Pr. The lattice strain and lattice defects will constitute factors for deactivation of photons having been exited. Therefore, Pr: LLGG having been prepared in Example 1, which has little lattice strain and little lattice defect, is capable of exhibiting good luminescence characteristics, such as the fluorescence intensity.

However, the inventors have found that Pr:LLGG having been prepared in Example 1, wherein the number of mols of Pr "y" takes a value of at least 1.35 (Pr doping concentration: at least 45 mol %), does not exhibit the luminescent characteristics. (Reference may be made to FIG. 9.) Therefore, in cases where Pr:LLGG having been prepared in Example 1 is to be used in use applications in which the luminescent characteristics are required, the number of mols of Pr "y" should preferably take a value falling within the range of 0<y<1.35.

As for the samples of Pr:YAG having been prepared in Comparative Example 1, it was revealed that, within the range of 0<y<0.3, the Vegard's law, which represents that the lattice constant alters approximately linearly with respect to an increase in number of mols of Pr "y," obtained. However, it was revealed that, in the cases of each of the samples of Pr:YAG having been prepared in Comparative Example 1, wherein y=0.3 and y=1.5, the lattice constant showed no marked alteration with respect to the increase in number of mols of Pr "y." From the results of the XRD measurement and the results of the calculation of the lattice constant, it was revealed that, in the cases of each of the samples of Pr:YAG having been prepared in Comparative Example 1, wherein y=0.3 and y=1.5, the heterogeneous phase arose as a by-product, and a part of Pr having been loaded was not capable of entering into the matrix oxide and was present as $PrAlO_3$. It was thus found that, with Pr:YAG described above, it was not always possible for the Pr doping at a high doping concentration to be achieved.

<Luminescence Characteristics>

As for each of the samples of the polycrystal sintered bodies having been prepared in Example 1 and Comparative Example 1, the sample was subjected to fluorescence spectrum (luminescence spectrum) measurement by use of a fluorescence spectrophotometer (F-4500, supplied by Hitachi, Ltd.).

Figure 7A:
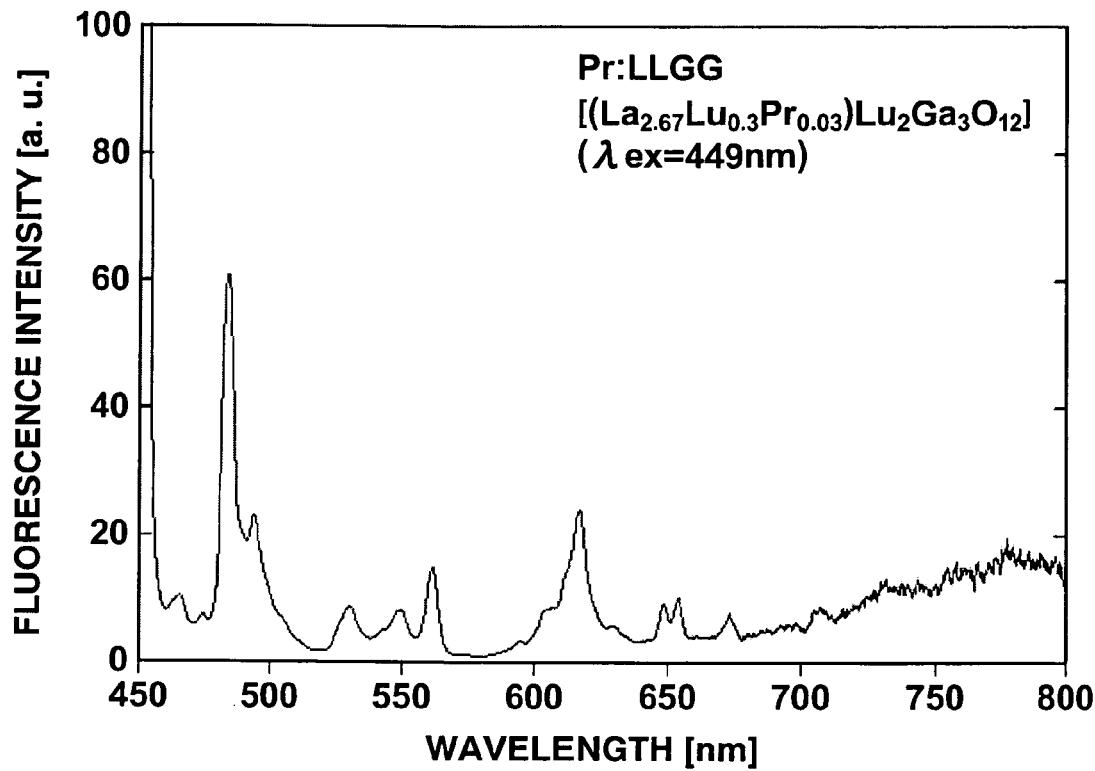
FIG. 7A is a graph showing a fluorescence spectrum of Pr:LLGG having been prepared in Example 1, the fluorescence spectrum being obtained with irradiation of exciting light having a certain excitation wavelength.
Figure 8A:
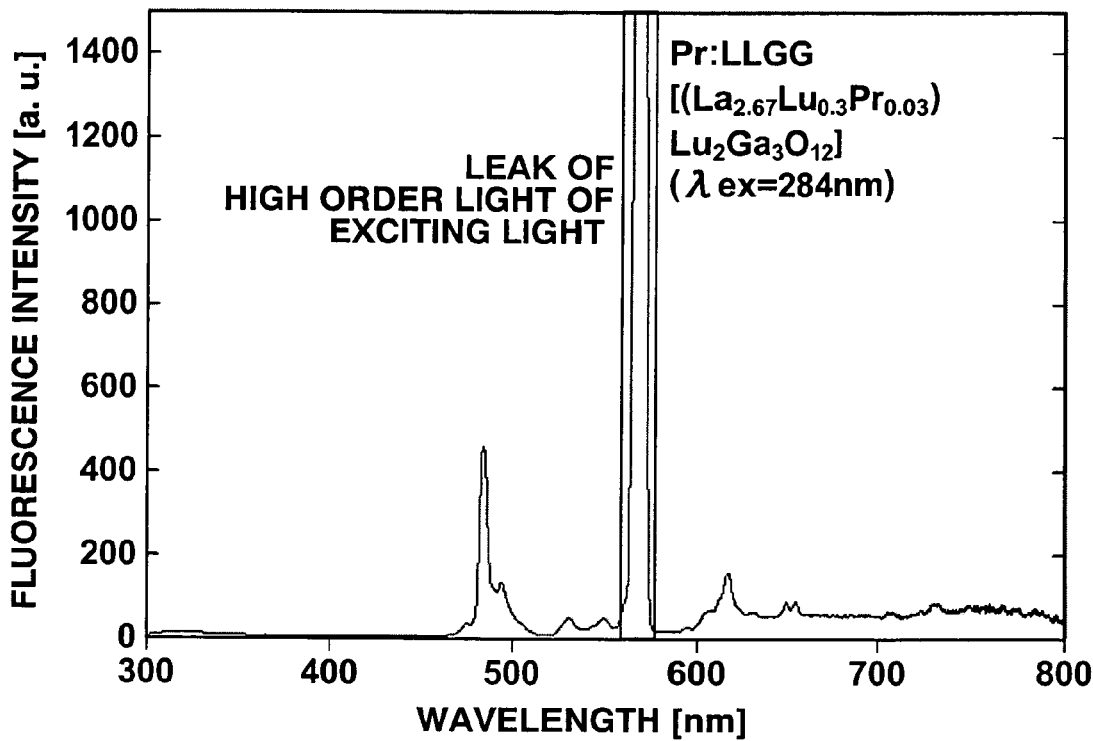
FIG. 8A is a graph showing a fluorescence spectrum of Pr:LLGG having been prepared in Example 1, the fluorescence spectrum being obtained with irradiation of exciting light having a certain excitation wavelength.

FIG. 7A is a graph showing a fluorescence spectrum of the sample of $(La_{2.67}Lu_{0.3}Pr_{0.03})Lu_2Ga_3O_{12}$ [y=0.03, Pr:LLGG] having been prepared in Example 1, the fluorescence spectrum being obtained with irradiation of exciting light having a certain excitation wavelength. FIG. 8A is a graph showing a fluorescence spectrum of the sample of $(La_{2.67}Lu_{0.3}Pr_{0.03})Lu_2Ga_3O_{12}$ [y=0.03, Pr: LLGG] having been prepared in Example 1, the fluorescence spectrum being obtained with irradiation of exciting light having a certain excitation wavelength. In the cases of the fluorescence spectrum illustrated in FIG. 7A, the excitation wavelength $\lambda_{ex}$ of the exciting light was set at 449 nm, which was associated with the second highest fluorescence intensity obtained when the excitation spectrum was taken. In the cases of the fluorescence spectrum illustrated in FIG. 8A, the excitation wavelength $\lambda_{ex}$ of the exciting light was set at 284 nm, which was associated with the highest fluorescence intensity obtained when the excitation spectrum was taken.

As illustrated in FIG. 7A and FIG. 8A, in each of the cases of the fluorescence spectrum illustrated in FIG. 7A, which was obtained when the excitation wavelength $\lambda_{ex}$ of the exciting light was set at 449 nm (for excitation with visible light), and the cases of the fluorescence spectrum illustrated in FIG. 8A, which was obtained when the excitation wavelength $\lambda_{ex}$ of the exciting light was set at 284 nm (for excitation with ultraviolet light), a plurality of fluorescence peaks were found over the entire visible light wavelength range (400 nm to 700 nm), and the fluorescence peak of the highest intensity was found at a wavelength of 484 nm.

Figure 7B:
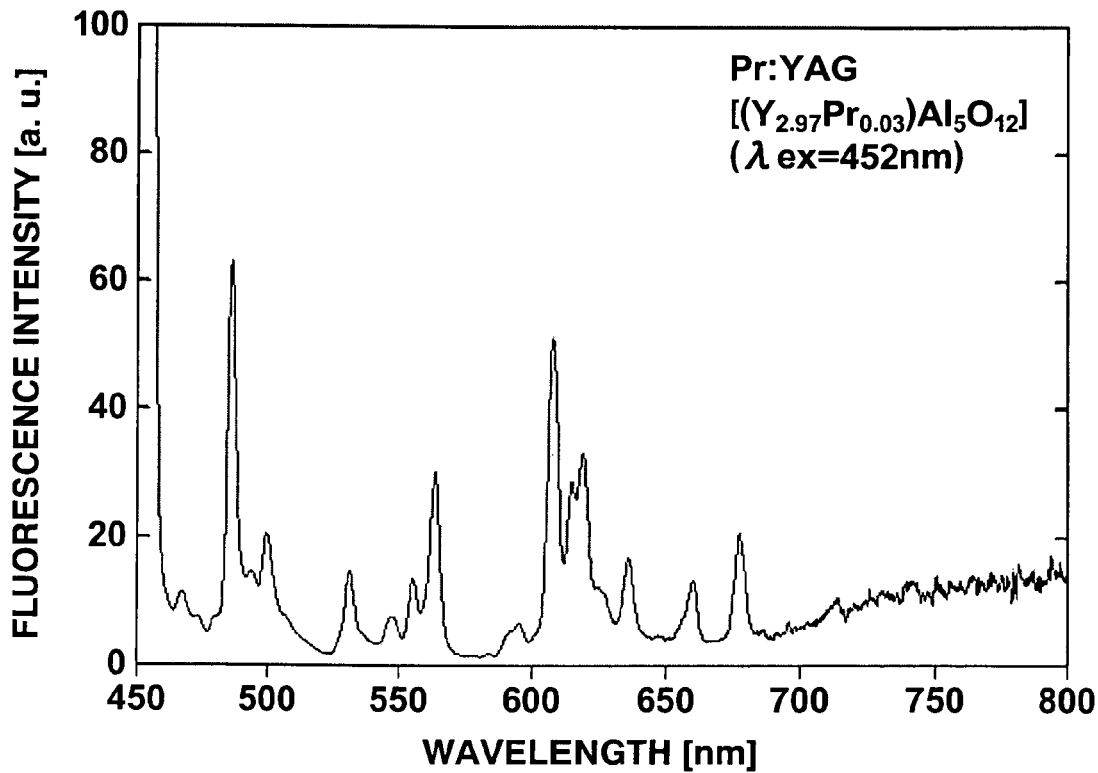
FIG. 7B is a graph showing a fluorescence spectrum of Pr:YAG having been prepared in Comparative Example 1, the fluorescence spectrum being obtained with irradiation of exciting light having a certain excitation wavelength.
Figure 8B:
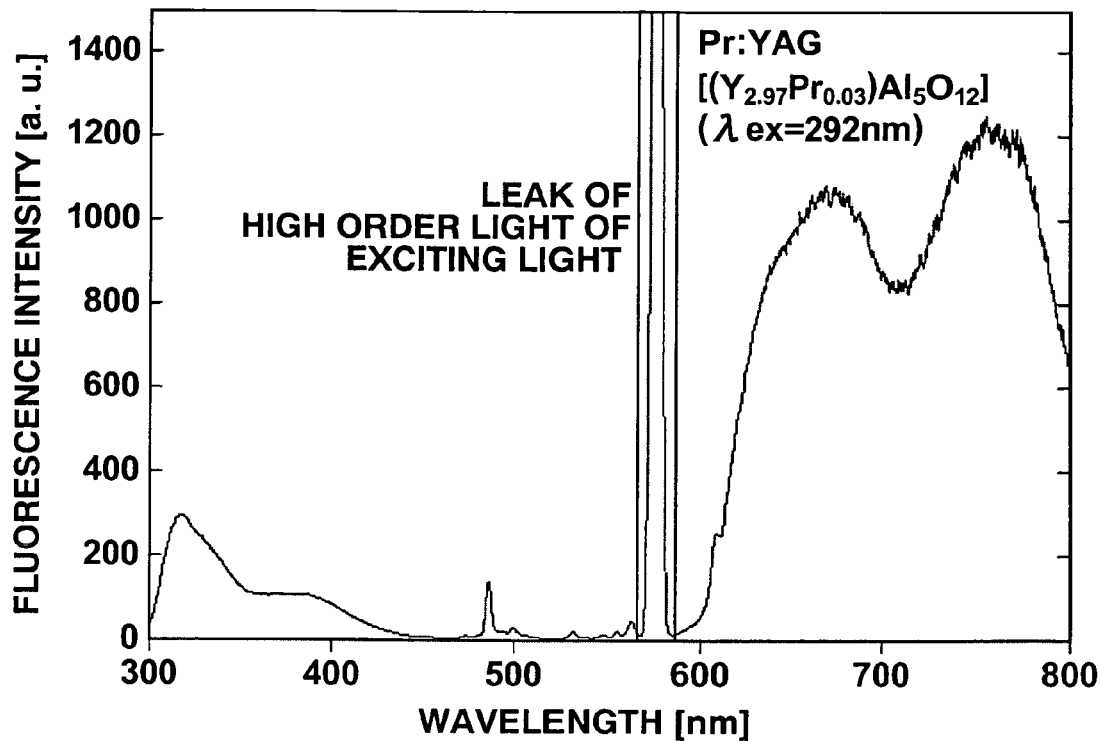
FIG. 8B is a graph showing a fluorescence spectrum of Pr:YAG having been prepared in Comparative Example 1, the fluorescence spectrum being obtained with irradiation of exciting light having a certain excitation wavelength.

FIG. 7B is a graph showing a fluorescence spectrum of the sample of $(Y_{2.97}Pr_{0.03})Al_5O_{12}$ [y=0.03, Pr:YAG] having been prepared in Comparative Example 1, the fluorescence spectrum being obtained with irradiation of exciting light having a certain excitation wavelength. FIG. 8B is a graph showing a fluorescence spectrum of the sample of $(Y_{2.97}Pr_{0.03})Al_5O_{12}$ [y=0.03, Pr:YAG] having been prepared in Comparative Example 1, the fluorescence spectrum being obtained with irradiation of exciting light having a certain excitation wavelength. In the cases of the fluorescence spectrum illustrated in FIG. 7B, the excitation wavelength $\lambda_{ex}$ of the exciting light was set at 452 nm, which was associated with the second highest fluorescence intensity obtained when the excitation spectrum was taken. In the cases of the fluorescence spectrum illustrated in FIG. 8B, the excitation wavelength $\lambda_{ex}$ of the exciting light was set at 292 nm, which was associated with the highest fluorescence intensity obtained when the excitation spectrum was taken.

In the cases of the fluorescence spectrum illustrated in FIG. 7B, which was obtained when the excitation wavelength $\lambda_{ex}$ of the exciting light was set at 452 nm (for excitation with visible light), a plurality of fluorescence peaks were found over the entire visible light wavelength range (400 nm to 700 nm), and the fluorescence peak of the highest intensity was found at a wavelength of 487 nm. In the cases of the fluorescence spectrum illustrated in FIG. 8B, which was obtained when the excitation wavelength $\lambda_{ex}$ of the exciting light was set at 292 nm (for excitation with ultraviolet light), a plurality of fluorescence peaks were found over the entire visible light wavelength range, and a broad spectrum was found in the ultraviolet light wavelength range and the red to infrared light wavelength range.

Under the conditions in which the number of mols of Pr "y" is equal to 0.03, in the cases of the excitation with visible light, no marked difference was found between Pr:LLGG having been prepared in Example 1 and Pr:YAG having been prepared in Comparative Example 1. However, it was revealed that, in the cases of the excitation with ultraviolet light, Pr:LLGG having been prepared in Example 1 exhibited the fluorescence intensity in the visible light wavelength range, which fluorescence intensity was higher than the fluorescence intensity obtained with Pr:YAG having been prepared in Comparative Example 1.

Figure 9:
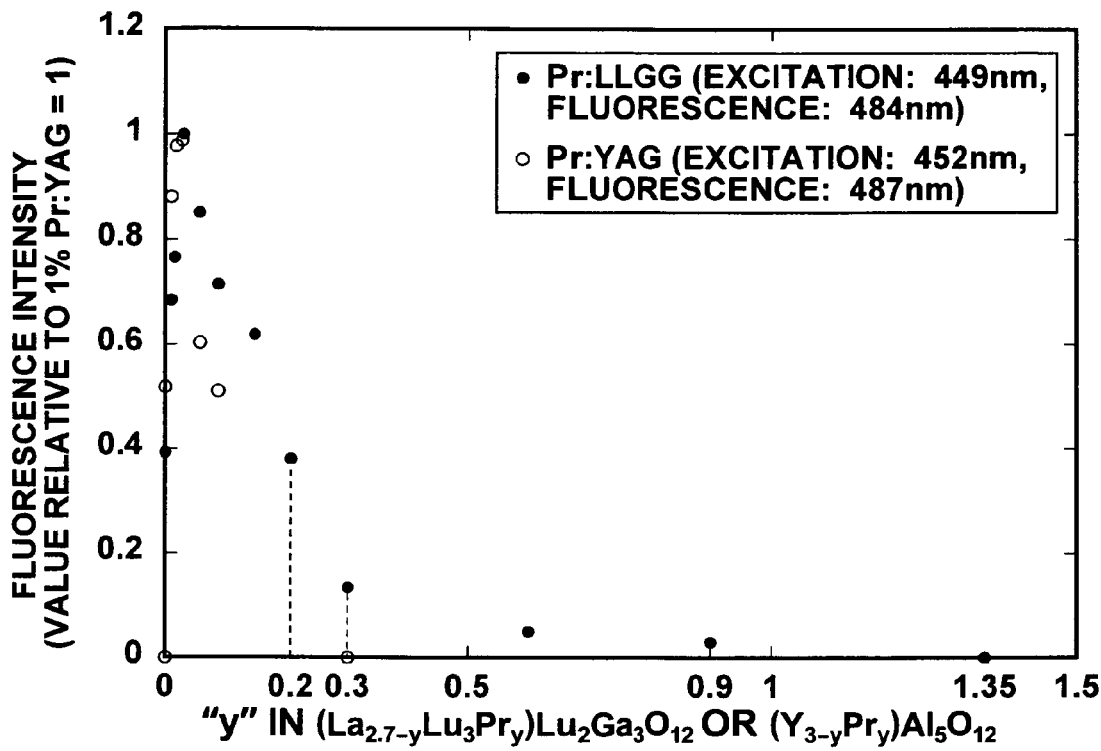
FIG. 9 is a graph showing a relationship between the number of mols of Pr "y" in Pr:LLGG having been prepared in Example 1 and a fluorescence intensity of Pr:LLGG having been prepared in Example 1, and the relationship between the number of mols of Pr "y" in Pr:YAG having been prepared in Comparative Example 1 and the fluorescence intensity of Pr:YAG having been prepared in Comparative Example 1.

FIG. 9 shows a relationship between the number of mols of Pr "y" in the samples of $(La_{2.7-y}Lu_{0.3}Pr_y)Lu_2Ga_3O_{12}$ [0<y≦2.7, Pr: LLGG] having been prepared in Example 1 and the fluorescence intensity of the samples having been prepared in Example 1, which fluorescence intensity was obtained at a wavelength of 484 nm when the excitation wavelength $\lambda_{ex}$ of the exciting light was set at 449 nm.

FIG. 9 also shows the relationship between the number of mols of Pr "y" in the samples of $(Y_{3-y}Pr_y)Al_5O_{12}$ [0<y≦1.5, Pr:YAG] having been prepared in Comparative Example 1 and the fluorescence intensity of the samples having been prepared in Comparative Example 1, which fluorescence intensity was obtained at a wavelength of 487 nm when the excitation wavelength $\lambda_{ex}$ of the exciting light was set at 452 nm.

In FIG. 9, the fluorescence intensity is represented by a relative value with respect to the fluorescence intensity of the 1.0% Pr: YAG compound having been prepared in Comparative Example 1 (wherein 1.0% represents the Pr doping concentration, expressed in units of mol %), the fluorescence intensity of the 1.0% Pr:YAG compound being obtained at a wavelength of 487 nm when the excitation wavelength $\lambda_{ex}$ of the exciting light was set at 452 nm, which fluorescence intensity is taken as 1.

As illustrated in FIG. 9, in the low Pr doping concentration region in which y≦0.03, no marked difference was found between the fluorescence intensity of Pr:LLGG having been prepared in Example 1 and the fluorescence intensity of Pr:YAG having been prepared in Comparative Example 1. Over the entire range of 0<y≦0.03, both Pr: LLGG having been prepared in Example 1 and Pr:YAG having been prepared in Comparative Example 1 exhibited a high fluorescence intensity.

Also, as illustrated in FIG. 9, in the higher Pr doping concentration region in which y>0.03, a concentration quenching phenomenon, such that the fluorescence intensity attenuates markedly, was found markedly with Pr:YAG having been prepared in Comparative Example 1. As for Pr:YAG having been prepared in Comparative Example 1, in cases where Pr was doped at a high doping concentration, the fluorescence intensity attenuated markedly. In the region of y≧0.3 (Pr doping concentration≧10 mol %), in which the heterogeneous phase arose, the fluorescence intensity of Pr:YAG having been prepared in Comparative Example 1 became equal to 0.

In contrast with Pr:YAG having been prepared in Comparative Example 1, Pr:LLGG having been prepared in Example 1 exhibited gentle concentration quenching and was capable of producing the fluorescence over a wide range of 0<y<1.35 (Pr doping concentration: more than 0 mol % to less than 45 mol %). It was thus revealed that, as for Pr:LLGG having been prepared in Example 1, in cases where Pr was doped at a high doping concentration, the occurrence of the lattice strain and the lattice defects was suppressed markedly, and good luminescence characteristics were capable of being obtained. It was thus confirmed that, as for Pr:LLGG having been prepared in Example 1, in cases where Pr was doped at a high doping concentration, little concentration quenching occurred. It was also confirmed that, as for Pr:LLGG having been prepared in Example 1, a high fluorescence intensity was capable of being obtained over the range of 0<y≦0.3, preferably 0<y≦0.21. Pr:LLGG having been prepared in Example 1, which exhibits little concentration quenching in the cases of the Pr doping at a high doping concentration, is useful and advantageous in that, for example, the exciting light absorption quantity is capable of being enhanced in cases where Pr:LLGG is used as the solid laser medium.

Referential Example 1

$(La_{3-x}Lu_x)Lu_2Ga_3O_{12}$ [$0 \leq x \leq 1.5$, LLGG]

Figure 10:
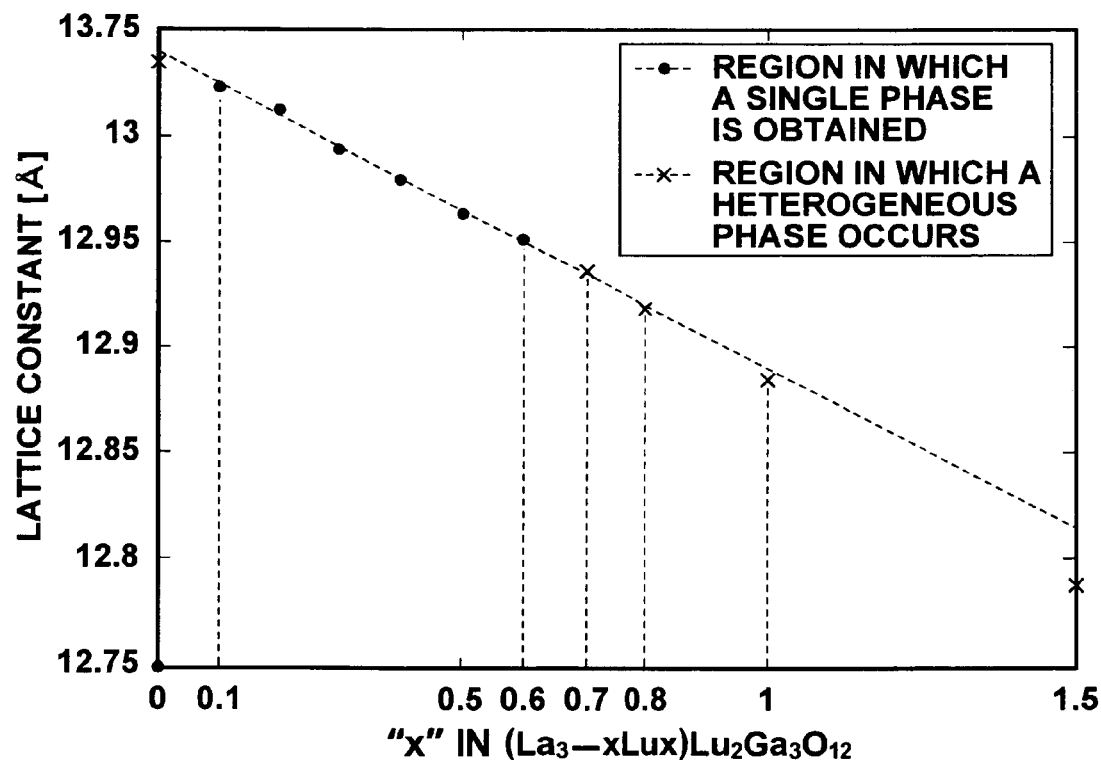
FIG. 10 is a graph showing a relationship between a number of mols of Lu "x" at an A site in LLGG having been prepared in Referential Example 1 and the lattice constant of LLGG having been prepared in Referential Example 1.

Experiments were conducted to find an appropriate range of the number of mols of Lu "x" at the A site in the matrix oxide LLGG. Specifically, polycrystal sintered bodies of LLGG were prepared in the same manner as that in Example 1, except that the composition of the raw material particles was altered. As the polycrystal sintered bodies of LLGG, 11 kinds of samples were prepared with processing, wherein the value of x was set at various different values of 0, 0.1, 0.2, 0.3, 0.4, 0.5, 0.6, 0.7, 0.8, 1.0, and 1.5. With respect to each of the samples of the polycrystal sintered bodies of LLGG, the XRD measurement was performed in the same manner as that in Example 1, and the lattice constant was calculated. FIG. 10 is a graph showing a relationship between the number of mols of Lu "x" at the A site in LLGG having been prepared in Referential Example 1 and the lattice constant of LLGG having been prepared in Referential Example 1.

From the results of the XRD measurement and the calculation of the lattice constant, it was revealed that a heterogeneous phase arose with LLGG, wherein no Lu was present at the A site (x=0), that LLGG had the single phase structure in cases where a small quantity of Lu entered into the A site, and that a heterogeneous phase arose with LLGG, wherein the number of mols of Lu "x" at the A site was at least equal to 0.7. As for LLGG, it was thus revealed that, in cases where the number of mols of Lu "x" at the A site satisfied the condition $0<x<0.7$, preferably the condition $0.1 \leq x \leq 0.6$, the alteration of the lattice constant with respect to the number of mols of Lu "x" at the A site well conformed to the Vegard's law, and the single phase structure, in which La and Lu had appropriately formed the solid solution, was capable of being obtained reliably.

Example 2

$Pr_3Lu_2Ga_3O_{12}$

A polycrystal sintered body of $Pr_3Lu_2Ga_3O_{12}$ having the composition, in which the A site was entirely substituted by Pr, was prepared in the same manner as that in Example 1, except that the composition of the raw material particles was altered. The thus prepared polycrystal sintered body was the non-luminescent body.

The results of the XRD measurement performed on the thus obtained polycrystal sintered body revealed that the polycrystal sintered body had the single phase structure. FIG. 6A also shows the results of the calculation of the lattice constant of the obtained polycrystal sintered body.

Example 3

$(La_{2.97-x}Lu_xPr_{0.03})Lu_2Ga_3O_{12}$ [$0 \leq x \leq 0.8$, Pr:LLGG]

In Example 1 described above, the number of mols of Lu "x" at the A site in General Formula (1) was fixed at 0.3, and the number of mols of Pr "y" in General Formula (1) was set at the various different values. In Example 3, each of polycrystal sintered bodies of Pr:LLGG in accordance with the present invention was prepared in the same manner as that in Example 1, except that the number of mols of Pr "y" in General Formula (1) was fixed at 0.03, the number of mols of Lu "x" at the A site in General Formula (1) was set at various different values, and the composition of the raw material particles was altered. As the polycrystal sintered bodies, 11 kinds of samples were prepared with processing, wherein the value of x in General Formula (1) was set at various different values of 0.0, 0.1, 0.183, 0.35, 0.367, 0.40, 0.45, 0.50, 0.552, 0.60, and 0.736.

Figure 11A:
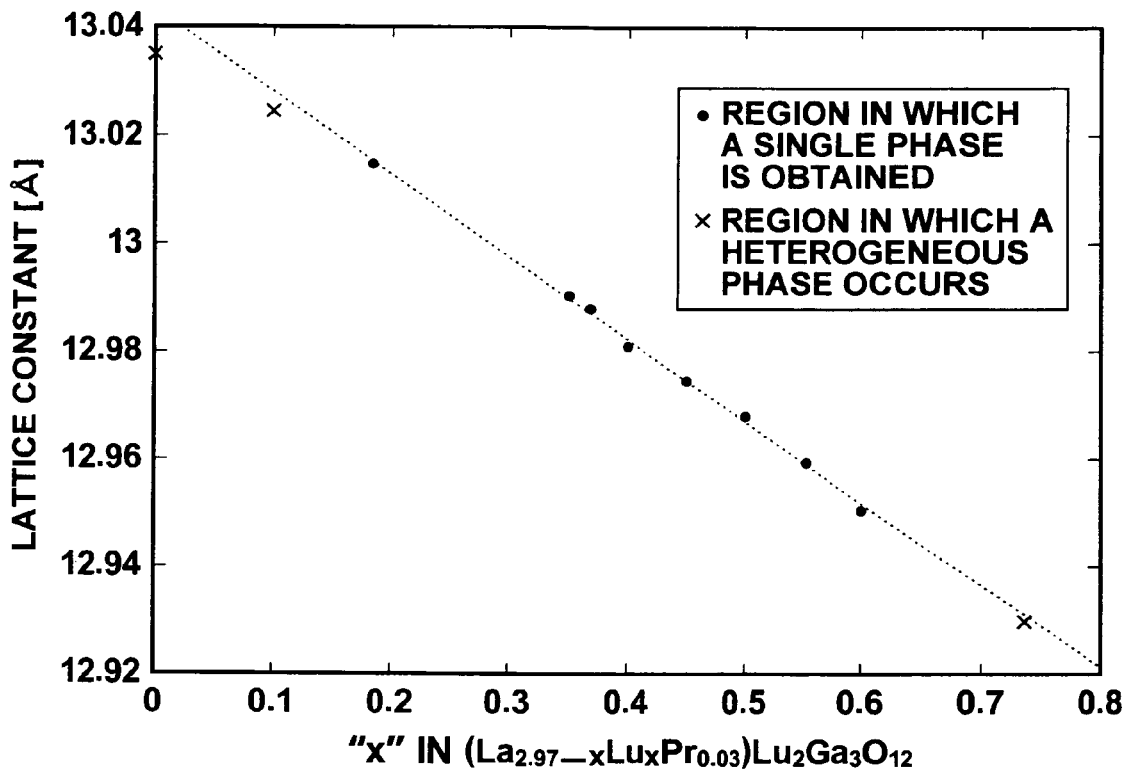
FIG. 11A is a graph showing the relationship between the number of mols of Lu "x" at the A site in Pr:LLGG having been prepared in Example 3 and the lattice constant of Pr:LLGG having been prepared in Example 3.

With respect to each of the thus obtained samples of the polycrystal sintered bodies, the XRD measurement was performed in the same manner as that in Example 1. From the results of the XRD measurement, it was revealed that a single phase structure was obtained in the range of $0<x<0.7$, preferably $0.2 \leq x \leq 0.6$, and that a heterogeneous phase slightly arose (to an extent such that the characteristics of the polycrystal sintered body might not be affected adversely) in cases where the value of x fell outside the aforesaid range. FIG. 11A shows the results of the calculation of the lattice constant of the aforesaid samples of the polycrystal sintered bodies, which calculation was made in the same manner as that in Example 1. As illustrated in FIG. 11A, the lattice constant of the compositions, with which the single phase structure was obtained, fell within the range of 12.94 Å to 13.03 Å.

Figure 11B:
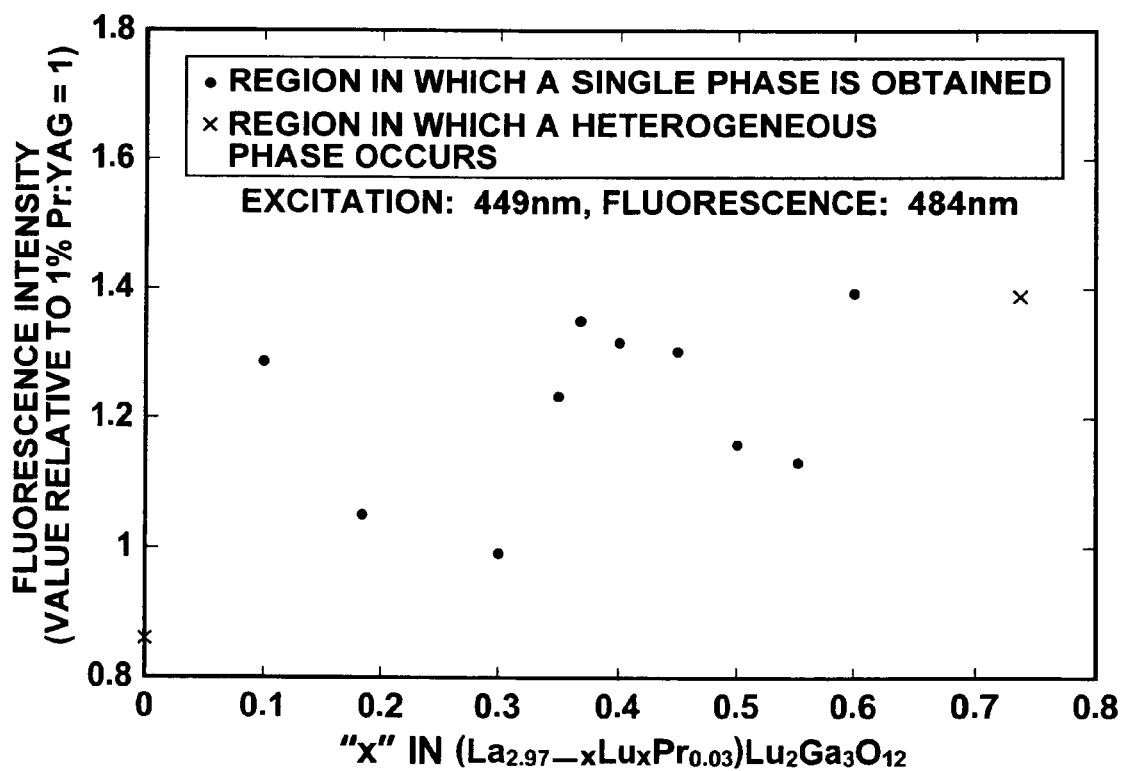
FIG. 11B is a graph showing the relationship between the number of mols of Lu "x" at the A site in Pr:LLGG having been prepared in Example 3 and the fluorescence intensity of Pr: LLGG having been prepared in Example 3.

As for each of the samples of the polycrystal sintered bodies having been prepared in Example 3, the sample was subjected to the fluorescence spectrum (luminescence spectrum) measurement, which was performed in the same manner as that in Example 1. FIG. 11B shows the relationship between the number of mols of Lu "x" at the A site in Pr:LLGG having been prepared in Example 3 and the fluorescence intensity of Pr:LLGG having been prepared in Example 3, which fluorescence intensity was obtained at a wavelength of 484 nm when the excitation wavelength $\lambda_{ex}$ of the exciting light was set at 449 nm. In FIG. 11B, the fluorescence intensity is represented by a relative value with respect to the fluorescence intensity of the 1.0% Pr:YAG compound having been prepared in Comparative Example 1 described above, the fluorescence intensity of the 1.0% Pr:YAG compound being obtained at a wavelength of 487 nm when the excitation wavelength $\lambda_{ex}$ of the exciting light was set at 452 nm, which fluorescence intensity is taken as 1.

As illustrated in FIG. 11B, it was revealed that, as for Pr:LLGG, a fluorescence intensity of a level at least equivalent to the level of the fluorescence intensity of Pr:YAG was capable of being obtained over the wide range of $0<x \leq 0.8$.

Example 4

$(La_{2.67}Lu_{0.3}Pr_{0.03})(Lu_{2-z}Ga_z)Ga_3O_{12}$ [$0 \leq z \leq 0.4$, Pr:LLGG]

In Example 4, experiments were conducted with respect to a system, in which the number of mols of Lu "x" at the A site in Pr:LLGG was fixed at 0.3, in which the number of mols of Pr "y" in Pr:LLGG was fixed at 0.03, and in which a part of Lu at the B site was substituted by Ga through the formation of the solid solution. Specifically, each of polycrystal sintered bodies of Pr: LLGG in accordance with the present invention was prepared in the same manner as that in Example 1, except that the number of mols of Ga "z" at the B site was set at various different values falling within the range of $0 \leq z \leq 0.4$, and the composition of the raw material particles was altered. As the polycrystal sintered bodies, five kinds of samples were prepared with processing, wherein the number of mols of Ga "z" was set at various different values of 0, 0.1, 0.2, 0.3, and 0.4.

Figure 12:
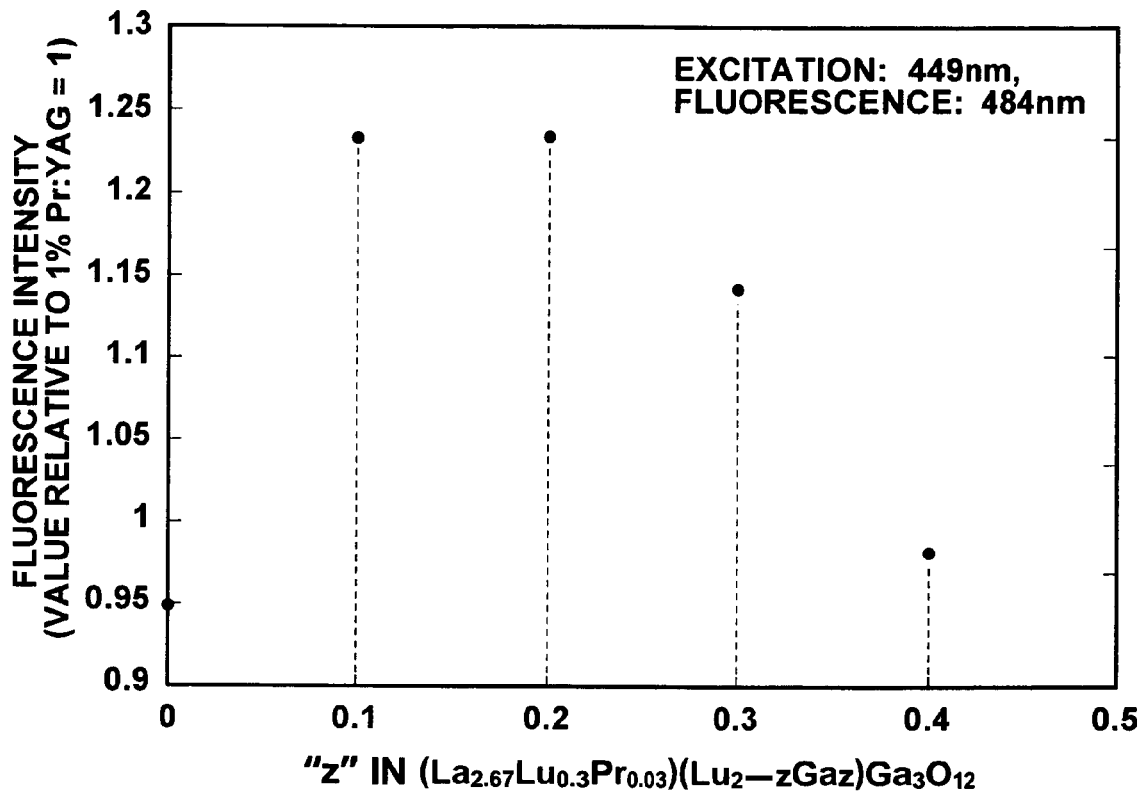
FIG. 12 is a graph showing a relationship between a number of mols of Ga "z" at a B site in Pr:LLGG having been prepared in Example 4 and the fluorescence intensity of Pr:LLGG having been prepared in Example 4.

As for each of the samples of the polycrystal sintered bodies having been prepared in Example 4, the sample was subjected to the fluorescence spectrum (luminescence spectrum) measurement, which was performed in the same manner as that in Example 3. FIG. 12 shows a relationship between the number of mols of Ga "z" at the B site in Pr:LLGG having been prepared in Example 4 and the fluorescence intensity of Pr:LLGG having been prepared in Example 4, which fluorescence intensity was obtained at a wavelength of 484 nm when the excitation wavelength $\lambda_{ex}$ of the exciting light was set at 449 nm. In FIG. 12, the fluorescence intensity is represented by a relative value with respect to the fluorescence intensity of the 1.0% Pr: YAG compound having been prepared in Comparative Example 1 described above, the fluorescence intensity of the 1.0% Pr:YAG compound being obtained at a wavelength of 487 nm when the excitation wavelength $\lambda_{ex}$ of the exciting light was set at 452 nm, which fluorescence intensity is taken as 1.

As illustrated in FIG. 11B, it was revealed that, as for Pr:LLGG having been prepared in Example 4, a fluorescence intensity of a level at least equivalent to the level of the fluorescence intensity of Pr:YAG was capable of being obtained within the range of $0 \leq z \leq 0.4$. It was also revealed that, as for Pr:LLGG having been prepared in Example 4, a fluorescence intensity higher than the fluorescence intensity of Pr:YAG was capable of being obtained particularly within the range of $0.1 \leq z \leq 0.3$. Specifically, it was revealed that, as for Pr:LLGG, in cases where a small quantity of Ga entered into the B site, the fluorescence intensity was capable of being enhanced.

However, the inventors have found from the results of the XRD measurement that, as for Pr:LLGG, in which $0.1 \leq z \leq 0.3$, a heterogeneous phase slightly arose (to an extent such that the characteristics of the polycrystal sintered body might not be affected adversely).

Example 5

$(La_{2.8-y}Sc_{0.2}Pr_y)Sc_2Ga_3O_{12}$ [$0<y \leq 2.8$, Pr:LSGG]

Each of polycrystal sintered bodies of a garnet type compound (1) (Pr: LSGG) in accordance with the present invention, which compound may be represented by General Formula (1), wherein A1 represents La, A2 represents Sc, B represents Sc, and C represents Ga, was prepared in the manner described below. The quantity of dry particles for the formation of a compression molded body was set at approximately 1.0 g.

As the polycrystal sintered bodies, 14 kinds of samples were prepared with processing, wherein the value of x in General Formula (1) was fixed at 0.2, and the value of y in General Formula (1) was set at various different values of 0.0015, 0.003, 0.015, 0.03, 0.06, 0.09, 0.15, 0.21, 0.30, 0.45, 0.60, 0.90, 1.35, and 2.80.

The polycrystal sintered bodies were prepared in the same manner as that in Example 1, except that $La_2O_3$ particles (purity: 99.99%), $Sc_2O_3$ particles (purity: 99.99%), $Ga_2O_3$ particles (purity: 99.99%), and $Pr_6O_{11}$ particles (purity: 99.99%) were used as the raw material particles, and the composition of the raw material particles was altered.

The composition of the raw material particles was set such that, for example, in the cases of y=0.03, the quantity of the $La_2O_3$ particles was 45.125 g, the quantity of the $Sc_2O_3$ particles was 15.170 g, the quantity of the $Ga_2O_3$ particles was 28.117 g, and the quantity of the $Pr_6O_{11}$ particles was 0.551 g.

Figure 13:
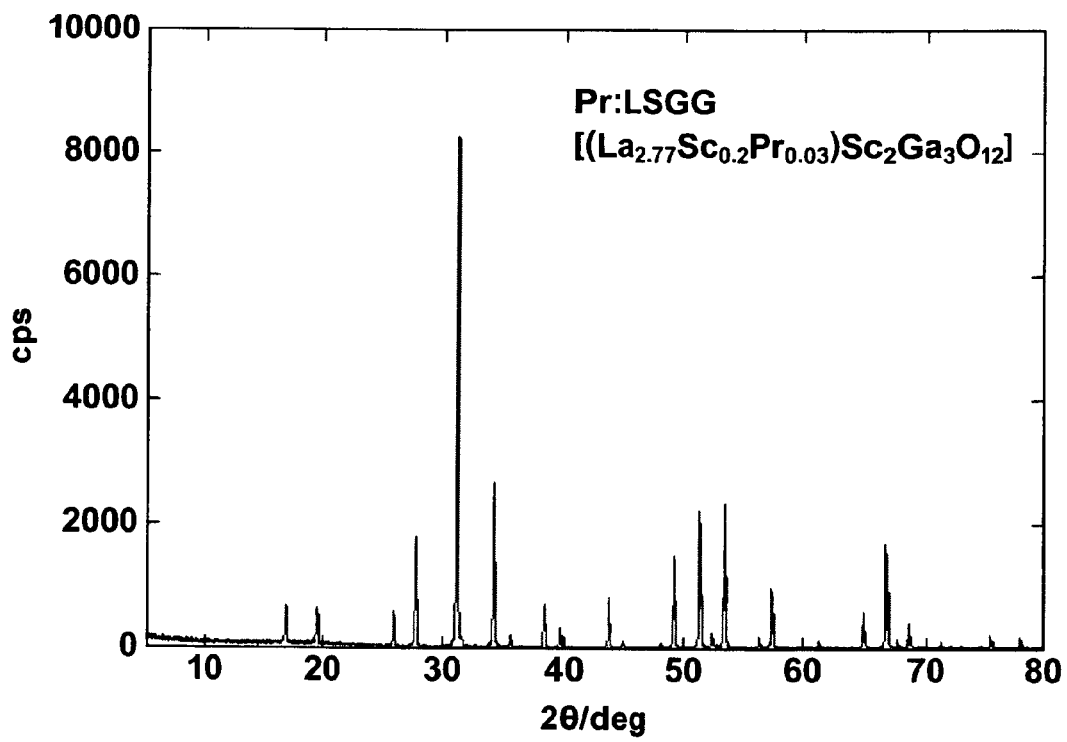
FIG. 13 is a graph showing the XRD pattern of Pr:LSGG having been prepared in Example 5.

As for each of the polycrystal sintered bodies having been prepared in Example 5, the XRD measurement was performed in the same manner as that in Example 1. From the results of the XRD measurement, it was confirmed that each of the polycrystal sintered bodies having been prepared in Example 5 had the singe phase structure. It was thus revealed that, in the cases of the samples of Pr:LSGG having been prepared in Example 5, over the entire range of $0<y \leq 2.8$, all of Pr, which had been loaded, entered into the matrix oxide, and La at the A site was appropriately substituted by Pr through the formation of the solid solution. As a typical example, FIG. 13 shows an XRD pattern of Pr:LSGG 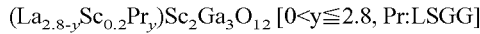 [$(La_{2.77}Sc_{0.2}Pr_{0.03})Sc_2Ga_3O_{12}$], which had been prepared in Example 5, and in which y=0.03.

Figure 14:
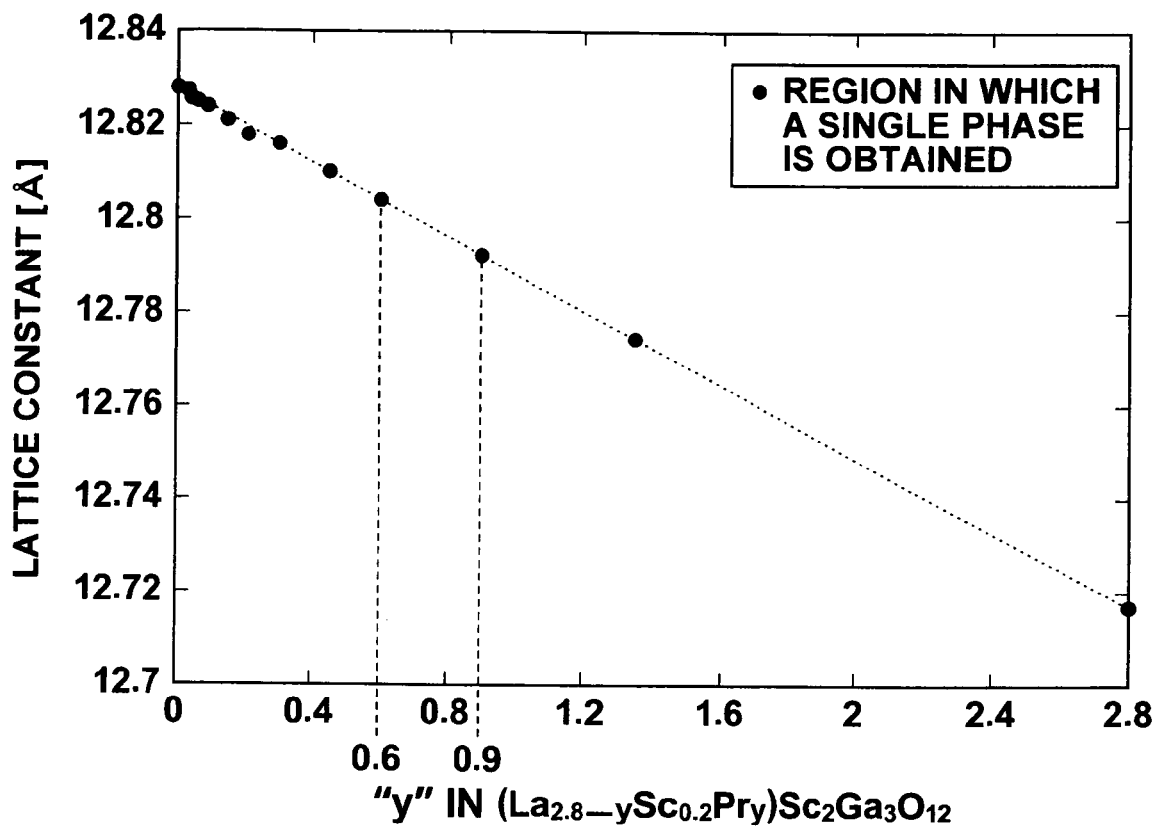
FIG. 14 is a graph showing the relationship between the number of mols of Pr "y" in Pr:LSGG having been prepared in Example 5 and the lattice constant of Pr:LSGG having been prepared in Example 5.

FIG. 14 shows the results of the calculation of the lattice constant of each of the polycrystal sintered bodies having been prepared in Example 5, which calculation was made in the same manner as that in Example 1.

As for the samples of $(La_{2.8-y}Sc_{0.2}Pr_y)Sc_2Ga_3O_{12}$ [$0<y \leq 2.8$, Pr:LSGG] having been prepared in Example 5, it was revealed that, over the entire range of $0<y \leq 2.8$, the Vegard's law, which represents that the lattice constant alters approximately linearly with respect to an increase in number of mols of Pr "y," obtained. It was thus revealed that, over the entire range of $0<y \leq 2.8$, and all of Pr, which had been loaded, entered into the matrix oxide, and La at the A site was appropriately substituted by Pr through the formation of the solid solution. The foregoing indicated that Pr is capable of being doped at an arbitrary doping concentration, and that it is also possible for all of La at the A site to be appropriately substituted by Pr through the formation of the solid solution (y=2.8 in cases where all of La at the A site has been substituted by Pr through the formation of the solid solution).

The approximately linear alteration of the lattice constant in accordance with the Vegard's law indicates that Pr having been doped and the matrix compound are well matched with each other. Also, the approximately linear alteration of the lattice constant in accordance with the Vegard's law indirectly indicates that, in the cases of the Pr doping at a high doping concentration, little lattice strain and little lattice defect arise in the vicinity of Pr. The lattice strain and lattice defects will constitute factors for deactivation of photons having been exited. Therefore, Pr:LSGG having been prepared in Example 5, which has little lattice strain and little lattice defect, is capable of exhibiting good luminescence characteristics, such as the fluorescence intensity.

As for each of the samples of the polycrystal sintered bodies having been prepared in Example 5, the sample was subjected to the fluorescence spectrum (luminescence spectrum) measurement, which was performed in the same manner as that in Example 1.

Figure 15A:
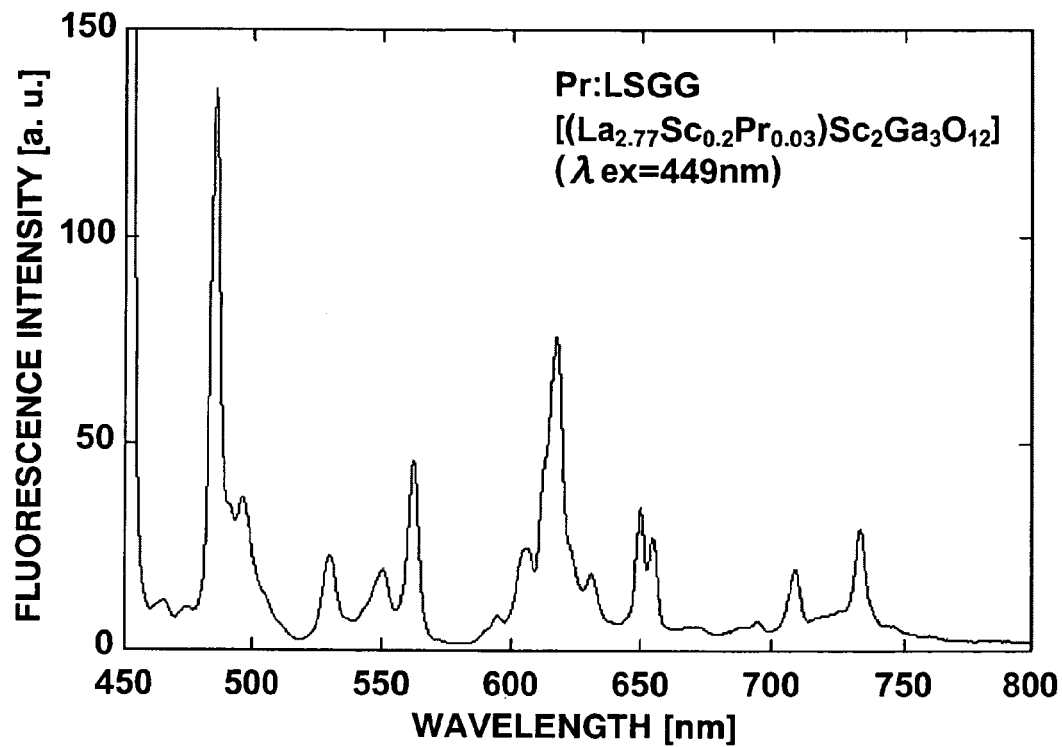
FIG. 15A is a graph showing the fluorescence spectrum of Pr: LSGG having been prepared in Example 5, the fluorescence spectrum being obtained with irradiation of exciting light having a certain excitation wavelength.
Figure 15B:
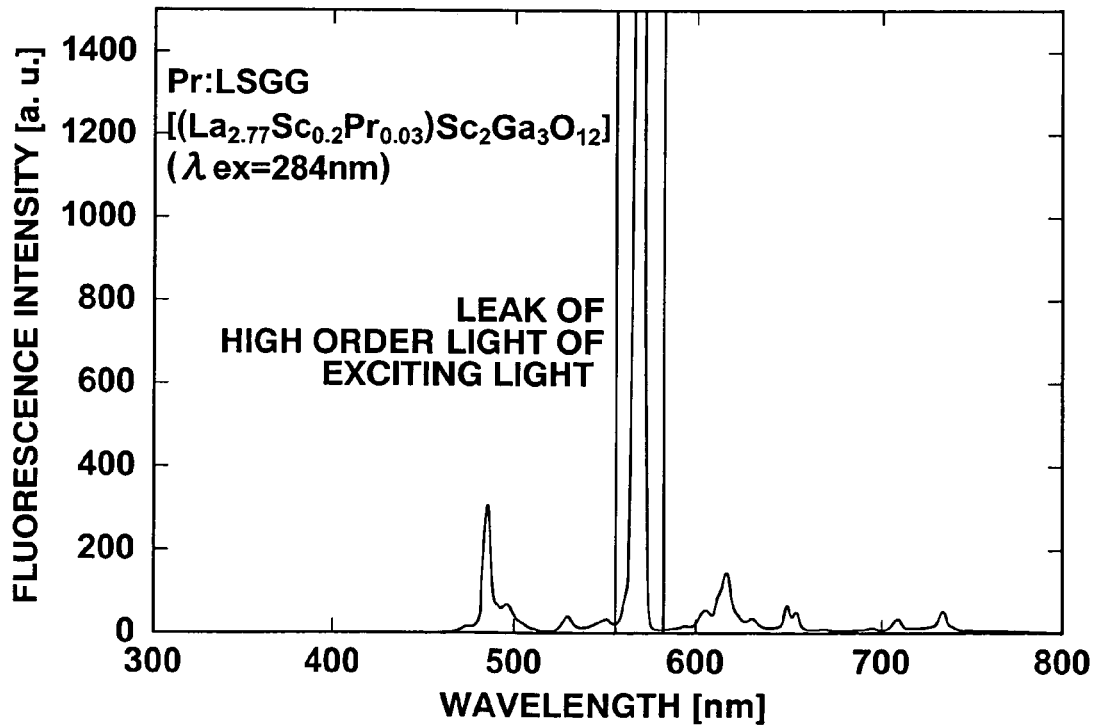
FIG. 15B is a graph showing the fluorescence spectrum of Pr:LSGG having been prepared in Example 5, the fluorescence spectrum being obtained with irradiation of exciting light having a certain excitation wavelength.

As a typical example, FIG. 15A shows a fluorescence spectrum of the sample of Pr:LSGG [$(La_{2.77}Sc_{0.2}Pr_{0.03})Sc_2Ga_3O_{12}$], which had been prepared in Example 5, and in which y=0.03, the fluorescence spectrum being obtained with irradiation of exciting light having a certain excitation wavelength. Also, FIG. 15B shows a fluorescence spectrum of the sample of Pr:LSGG [$(La_{2.77}Sc_{0.2}Pr_{0.03})Sc_2Ga_3O_{12}$], which had been prepared in Example 5, and in which y=0.03, the fluorescence spectrum being obtained with irradiation of exciting light having a certain excitation wavelength. In the cases of the fluorescence spectrum illustrated in FIG. 15A, the excitation wavelength $\lambda_{ex}$ of the exciting light was set at 449 nm, which was associated with the second highest fluorescence intensity obtained when the excitation spectrum was taken. In the cases of the fluorescence spectrum illustrated in FIG. 15B, the excitation wavelength $\lambda_{ex}$ of the exciting light was set at 284 nm, which was associated with the highest fluorescence intensity obtained when the excitation spectrum was taken.

As illustrated in FIG. 15A and FIG. 15B, in each of the cases of the fluorescence spectrum illustrated in FIG. 15A, which was obtained when the excitation wavelength $\lambda_{ex}$ of the exciting light was set at 449 nm (for excitation with visible light), and the cases of the fluorescence spectrum illustrated in FIG. 15B, which was obtained when the excitation wavelength $\lambda_{ex}$ of the exciting light was set at 284 nm (for excitation with ultraviolet light), a plurality of fluorescence peaks were found in the visible light wavelength range (400 nm to 700 nm), and the fluorescence peak of the highest intensity was found at a wavelength of 484 nm.

Figure 16:
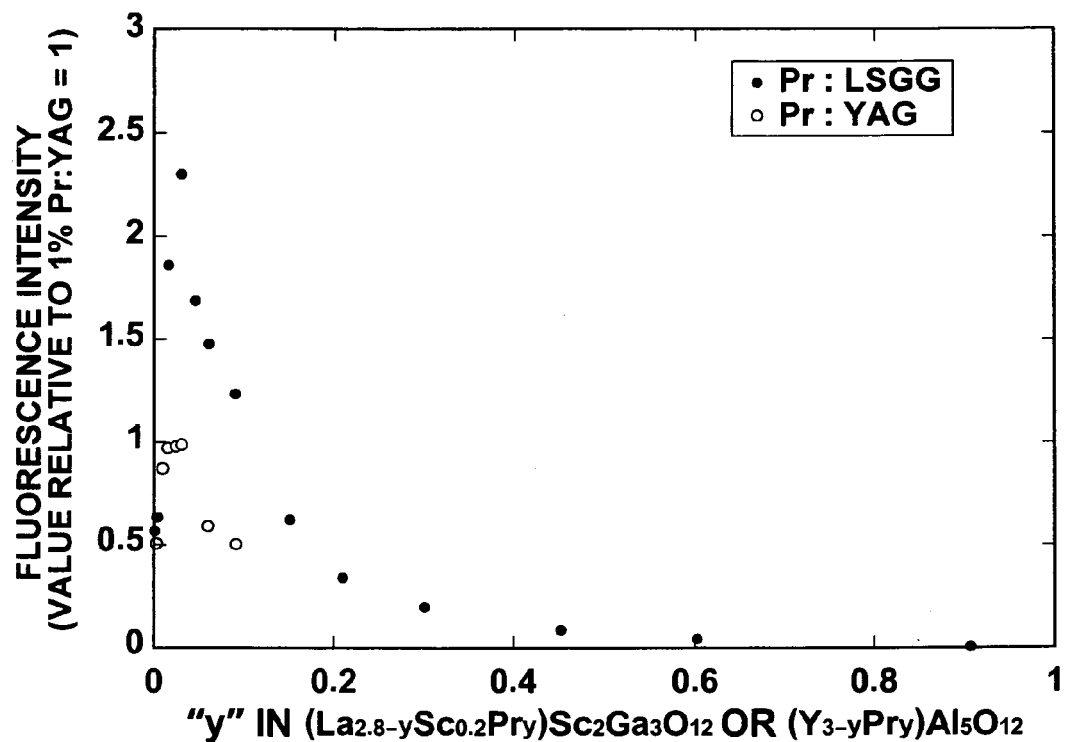
FIG. 16 is a graph showing the relationship between the number of mols of Pr "y" in Pr:LSGG having been prepared in Example 5 and the fluorescence intensity of Pr:LSGG having been prepared in Example 5.

FIG. 16 shows a relationship between the number of mols of Pr "y" in the samples of $(La_{2.8-y}Sc_{0.2}Pr_y)Sc_2Ga_3O_{12}$ [$0<y\leqq 2.8$, Pr:LSGG] having been prepared in Example 5 and the fluorescence intensity of the samples having been prepared in Example 5, which fluorescence intensity was obtained at a wavelength of 484 nm when the excitation wavelength $\lambda_{ex}$ of the exciting light was set at 449 nm. In FIG. 16, the fluorescence intensity is represented by a relative value with respect to the fluorescence intensity of the 1.0% Pr:YAG compound having been prepared in Comparative Example 1, the fluorescence intensity of the 1.0% Pr:YAG compound being obtained at a wavelength of 487 nm when the excitation wavelength $\lambda_{ex}$ of the exciting light was set at 452 nm, which fluorescence intensity is taken as 1. FIG. 16 also shows data on Pr:YAG.

As illustrated in FIG. 16, as for Pr:LSGG having been prepared in Example 5, no luminescent characteristics were exhibited in cases where $y\geqq 0.9$, and the luminescent characteristics were exhibited in cases where $0<y\leqq 0.6$. Specifically, it was revealed that, with the compositions of Example 5, the luminescent characteristics were exhibited in cases where $0<y<0.9$, preferably $0<y\leqq 0.6$. Also, it was revealed that, with Pr:LSGG of Example 5, a fluorescence intensity higher than the fluorescence intensity of Pr:YAG was capable of being obtained over the range of $0<y\leqq 0.6$.

Example 6

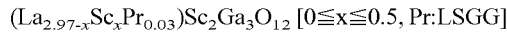
$(La_{2.97-x}Sc_xPr_{0.03})Sc_2Ga_3O_{12}$ [$0\leqq x\leqq 0.5$, Pr:LSGG]

In Example 5 described above, the number of mols of Sc "x" at the A site in General Formula (1) was fixed at 0.2, and the number of mols of Pr "y" in General Formula (1) was set at the various different values. In Example 6, each of polycrystal sintered bodies of Pr:LSGG in accordance with the present invention was prepared in the same manner as that in Example 5, except that the number of mols of Pr "y" in General Formula (1) was fixed at 0.03, the number of mols of Sc "x" at the A site in General Formula (1) was set at various different values, and the composition of the raw material particles was altered.

As the polycrystal sintered bodies, 10 kinds of samples were prepared with processing, wherein the value of x in General Formula (1) was set at various different values of 0.0, 0.05, 0.10, 0.15, 0.20, 0.25, 0.30, 0.35, 0.40, and 0.50.

Figure 17:
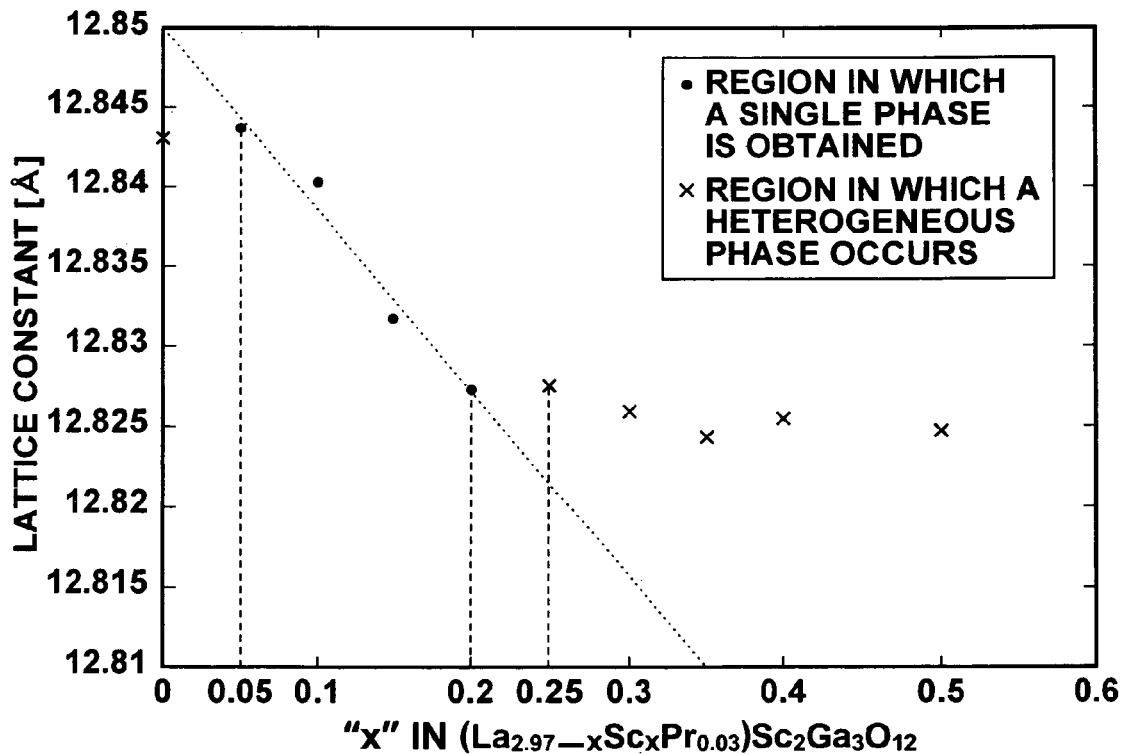
FIG. 17 is a graph showing a relationship between a number of mols of Sc "x" at the A site in Pr:LSGG having been prepared in Example 6 and the lattice constant of Pr:LSGG having been prepared in Example 6.

With respect to each of the thus obtained samples of the polycrystal sintered bodies, the XRD measurement was performed in the same manner as that in Example 1. From the results of the XRD measurement, it was revealed that a single phase structure was obtained in the range of $0<x<0.25$, preferably $0.05\leqq x\leqq 0.2$, and that a heterogeneous phase slightly arose (to an extent such that the characteristics of the polycrystal sintered body might not be affected adversely) in cases where the value of x fell outside the aforesaid range. FIG. 17 shows the results of the calculation of the lattice constant of the aforesaid samples of the polycrystal sintered bodies having been prepared in Example 6, which calculation was made in the same manner as that in Example 1.

Figure 18:
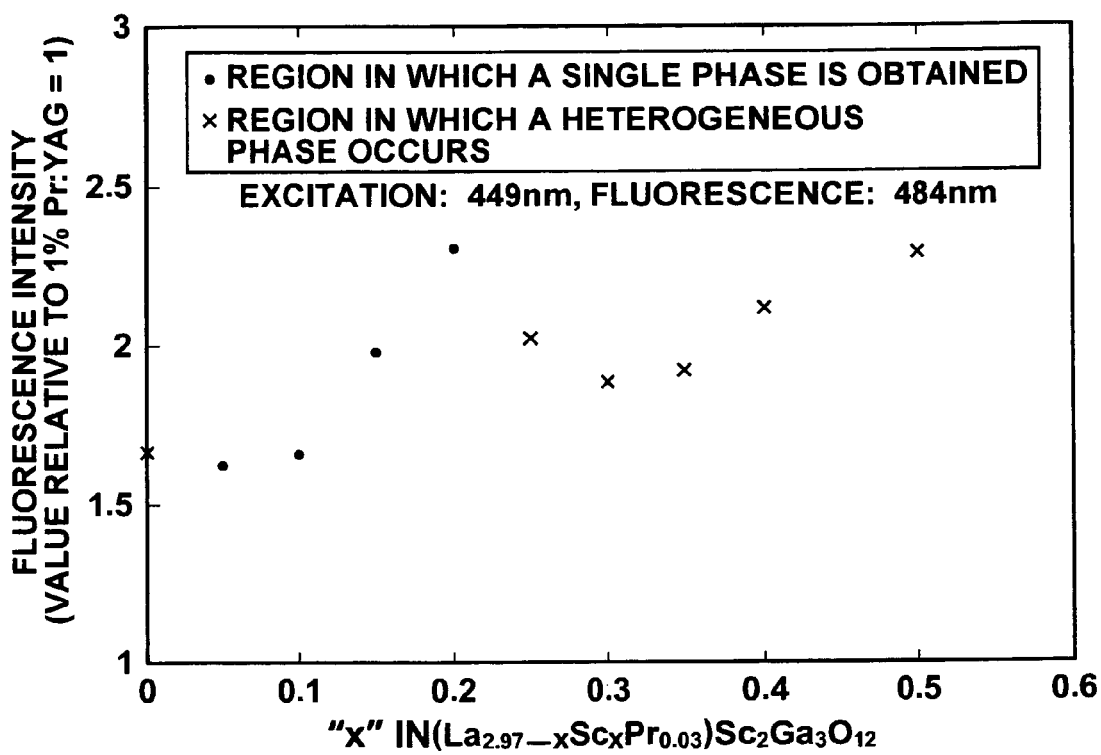
FIG. 18 is a graph showing a relationship between the number of mols of Sc "x" at the A site in Pr:LSGG having been prepared in Example 6 and the fluorescence intensity of Pr:LSGG having been prepared in Example 6.

As for each of the samples of the polycrystal sintered bodies having been prepared in Example 6, the sample was subjected to the fluorescence spectrum (luminescence spectrum) measurement, which was performed in the same manner as that in Example 1. FIG. 18 shows the relationship between the number of mols of Sc "x" at the A site in Pr:LSGG having been prepared in Example 6 and the fluorescence intensity of Pr:LSGG having been prepared in Example 6, which fluorescence intensity was obtained at a wavelength of 484 nm when the excitation wavelength $\lambda_{ex}$ of the exciting light was set at 449 nm. In FIG. 18, the fluorescence intensity is represented by a relative value with respect to the fluorescence intensity of the 1.0% Pr:YAG compound having been prepared in Comparative Example 1 described above, the fluorescence intensity of the 1.0% Pr: YAG compound being obtained at a wavelength of 487 nm when the excitation wavelength $\lambda_{ex}$ of the exciting light was set at 452 nm, which fluorescence intensity is taken as 1.

As illustrated in FIG. 18, it was revealed that, as for Pr:LSGG, over the entire range of $0\leqq x\leqq 0.5$, a fluorescence intensity higher than the fluorescence intensity of Pr:YAG was capable of being obtained, and a fluorescence intensity at least 1.5 times as high as the fluorescence intensity of Pr:YAG was capable of being obtained. As clear from a comparison made between FIG. 11B and FIG. 18, it was revealed that, with Pr:LSGG, a fluorescence intensity higher than the fluorescence intensity of Pr:LLGG was capable of being obtained.

Example 7

$(La_{0.99}Pr_{0.01})GaO_3$ [Pr:LaGaO$_3$]

A polycrystal sintered body of a perovskite type compound (5) (Pr:LaGaO$_3$) in accordance with the present invention, which compound may be represented by General Formula (5), wherein A1 represents La, the quantity of A2 is equal to zero, and B represents Ga, was prepared in the manner described below. Specifically, the polycrystal sintered body of the perovskite type compound (5) was prepared in the same manner as that in Example 1, except that the composition of the raw material particles was altered.

As for the thus prepared polycrystal sintered body, the XRD measurement was performed in the same manner as that in Example 1. From the results of the XRD measurement, it was confirmed that the polycrystal sintered body had the single phase structure.

Figure 19:
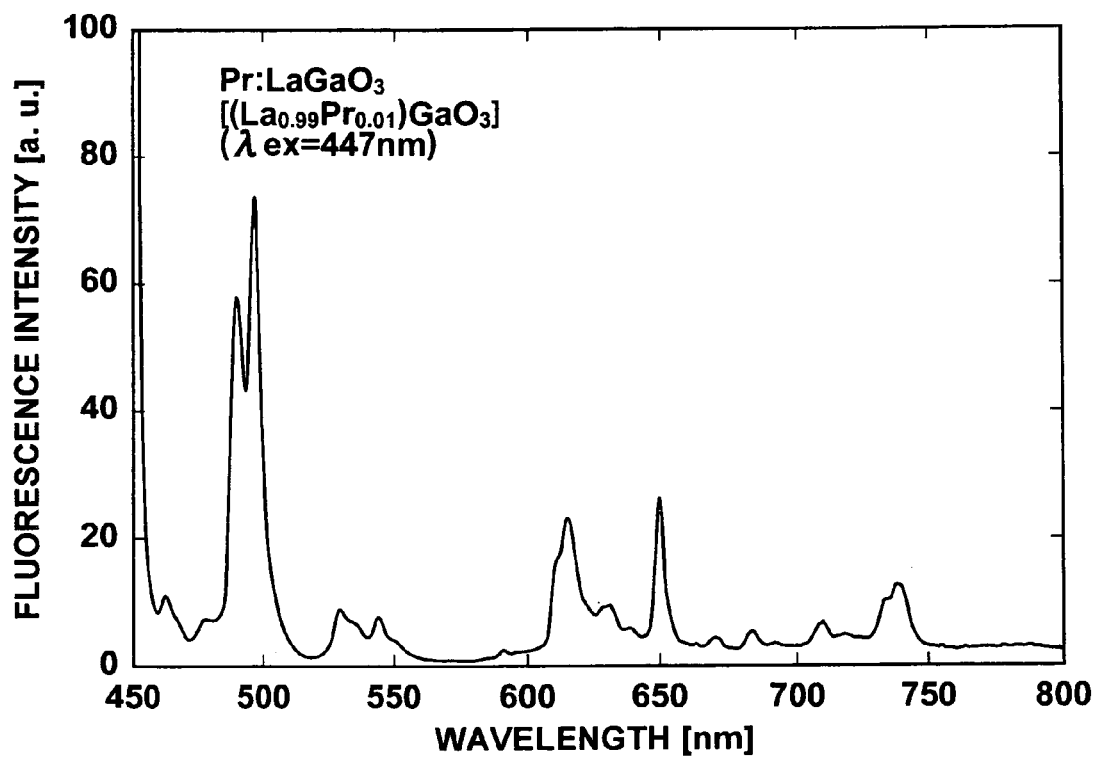
FIG. 19 is a graph showing the fluorescence spectrum of Pr: LaGaO$_3$ having been prepared in Example 7, the fluorescence spectrum being obtained with irradiation of exciting light having a certain excitation wavelength.
Figure 20:
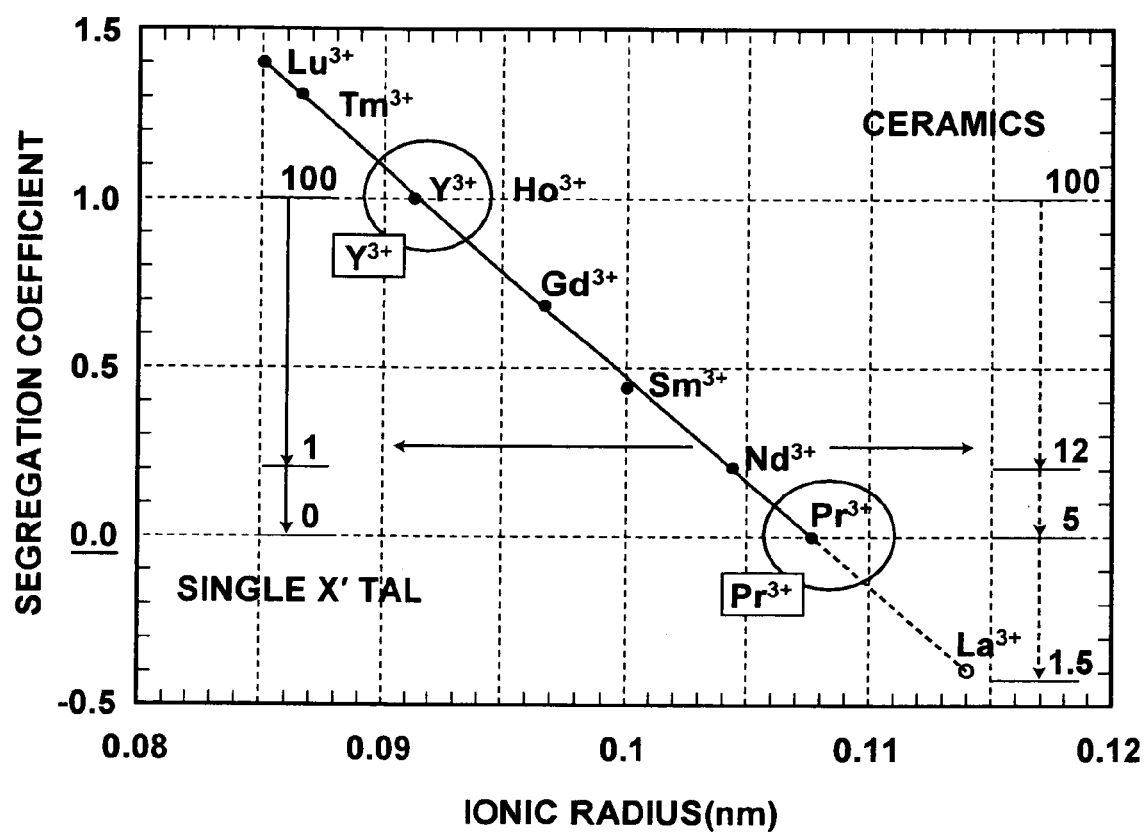
FIG. 20 is a graph showing relationships between ionic radiuses of rare earth element ions, which are to be doped in YAG, and segregation coefficients of the rare earth element ions.

As for the polycrystal sintered body having been prepared in Example 7, the fluorescence spectrum (luminescence spectrum) measurement was performed in the same manner as that in Example 1. FIG. 19 is a graph showing the fluorescence spectrum of Pr:LaGaO$_3$ having been prepared in Example 7, the fluorescence spectrum being obtained with irradiation of exciting light having a certain excitation wavelength. In the cases of the fluorescence spectrum illustrated in FIG. 19, the excitation wavelength $\lambda_{ex}$ of the exciting light was set at 447 nm, which was associated with the second highest fluorescence intensity obtained when the excitation spectrum was taken. As in the cases of Pr:LLGG and Pr:LSGG, a plurality of fluorescence peaks were found over the entire visible light wavelength range (400 nm to 700 nm). Also, the fluorescence peak of the second highest intensity was found at a wavelength of 484 nm, and the fluorescence peak of the highest intensity was found at a wavelength of 496 nm. The fluorescence intensity was of the level at least equivalent to the level of the fluorescence intensity of 1.0% Pr:YAG.

INDUSTRIAL APPLICABILITY

The Pr-doped inorganic compound in accordance with the present invention is capable of being appropriately applied to Pr-doped garnet type compounds, and the like. The compound in accordance with the present invention is capable of being utilized in use applications of fluorescent substances for white light emitting diodes, solid laser media, fiber amplifiers, scintillators, and the like.

What is claimed is:

1. A Pr-doped inorganic compound, containing a solid solution having been formed by substitution of at least a part of at least one kind of substitutable ions, which are contained at a substitutable ion site in a matrix oxide, by Pr, the Pr-doped inorganic compound satisfying the condition represented by the formula:

$$0.91r2 \leqq r1 \leqq 1.05r2$$

wherein r1 represents the mean ionic radius of ionic radiuses of all of elements, including Pr, which elements constitute the substitutable ion site having been doped with Pr, and r2 represents the ionic radius of Pr; and wherein the Pr-doped inorganic compound is a garnet type compound, which may be represented by General Formula (1):

$$(Al_{3-x-y}A2_xPr_y)B_2C_3O_{12} \quad (1)$$

wherein A1 represents La,
A2 represents Sc,
B represents Sc,
C represents Ga,
x represents a number satisfying the condition $0 \leqq x < 0.25$,
y represents a number satisfying the condition $0 < y \leqq 3$,
provided that $0 < x+y \leqq 3$, and
O represents the oxygen atom.

2. A Pr-doped inorganic compound, containing a solid solution having been formed by substitution of at least a part of at least one kind of substitutable ions, which are contained at a substitutable ion site in a matrix oxide, by Pr, the Pr-doped inorganic compound satisfying the condition represented by the formula:

$$0.91r2 \leqq r1 \leqq 1.05r2$$

wherein r1 represents the mean ionic radius of ionic radiuses of all of elements, including Pr, which elements constitute the substitutable ion site having been doped with Pr, and r2 represents the ionic radius of Pr, wherein the Pr-doped inorganic compound is a garnet type compound, which is represented by General Formula (2a):

$$(Al_{3-x-y}A2_xPr_y)(B1_{2-z}B2_z)C_3O_{12} \quad (2a)$$

wherein each of A1, A2, and Pr represents the element at the A site, each of B1 and B2 represents the element at the B site,
C represents the element at the C site,
A1 represents La,
A2 represents Lu,
B1 represents Lu,
B2 represents Ga,
C represents Ga,
x represents a number satisfying the condition $0 \leqq x < 3$,
y represents a number satisfying the condition $0 < y \leqq 3$,
provided that $0 < x+y \leqq 3$,
represents a number satisfying the condition $0 < z \leqq 0.4$, and
O represents the oxygen atom.

3. A Pr-doped inorganic compound as defined in claim 1 wherein the Pr-doped inorganic compound has a cubic system crystal structure.

4. A Pr-doped inorganic compound as defined in claim 1, wherein, in General Formula (1), y represents a number satisfying the condition $0 < y < 1.35$.

5. A Pr-doped inorganic compound as defined in claim 1, wherein, in General Formula (1), y represents a number satisfying the condition $0 < y < 0.9$.

6. A luminescent composition, containing a Pr-doped inorganic compound as defined in claim 1.

7. A luminescent body, containing a Pr-doped inorganic compound as defined in claim 1, the luminescent body having been formed into a predetermined shape.

8. A luminescent body as defined in claim 7 wherein the luminescent body takes on the form selected from the group consisting of a single crystal body of the Pr-doped inorganic compound, a polycrystal sintered body of the Pr-doped inorganic compound, and a molded body, which contains a solid medium and particles of the Pr-doped inorganic compound having been dispersed in the solid medium.

9. A light emitting device, comprising:
i) a luminescent body as defined in claim 7, and
ii) an exciting light source for producing exciting light to be irradiated to the luminescent body.

10. A solid laser device, comprising:
a solid laser medium constituted of a luminescent body as defined in claim 7, and
ii) an exciting light source for producing exciting light to be irradiated to the solid laser medium.

11. An ionizing radiation detecting device, comprising:
i) a scintillator constituted of a luminescent body as defined in claim 7, and
ii) a scintillation photodetector for detecting light, which has been radiated out from the scintillator.

* * * * *